United States Patent
Kojitani et al.

(10) Patent No.: US 8,421,803 B2
(45) Date of Patent: Apr. 16, 2013

(54) INFORMATION DISPLAY SYSTEM AND INFORMATION DISPLAY METHOD FOR QUALITY CONTROL OF COMPONENT-MOUNTED SUBSTRATE

(75) Inventors: Kazuto Kojitani, Osaka (JP); Keiji Otaka, Kyoto (JP); Hiroyuki Mori, Nagaokakyo (JP)

(73) Assignee: Omron Corporation, Kyoto (JP)

( * ) Notice: Subject to any disclaimer, the term of this patent is extended or adjusted under 35 U.S.C. 154(b) by 609 days.

(21) Appl. No.: 12/692,012

(22) Filed: Jan. 22, 2010

(65) Prior Publication Data
US 2010/0188417 A1    Jul. 29, 2010

(30) Foreign Application Priority Data
Jan. 27, 2009  (JP) ................ P2009-015930

(51) Int. Cl.
*G06T 11/20*    (2006.01)
(52) U.S. Cl.
USPC ........ 345/440; 345/440.2; 382/144; 382/145; 382/146; 382/147; 382/148; 382/149; 382/150; 700/109; 700/110; 700/143; 700/204; 700/222; 715/212; 715/215
(58) Field of Classification Search .............. 345/440, 345/440.2; 382/144–150; 700/109, 110, 700/143, 204, 222, 244; 702/81, 84; 715/212, 715/215
See application file for complete search history.

(56) References Cited

U.S. PATENT DOCUMENTS

| | | | | |
|---|---|---|---|---|
| 6,278,797 B1 * | 8/2001 | Nagasaki et al. | ............ | 382/146 |
| 6,384,847 B1 * | 5/2002 | Rabenhorst | ................... | 715/804 |
| 6,493,082 B2 * | 12/2002 | Nara et al. | ................... | 356/394 |
| 7,512,875 B2 * | 3/2009 | Davis | ........................... | 715/215 |
| 2005/0196033 A1 * | 9/2005 | Hamamatsu et al. | ......... | 382/149 |
| 2006/0140471 A1 * | 6/2006 | Murakami et al. | ............ | 382/145 |
| 2008/0204405 A1 * | 8/2008 | Koike et al. | ................... | 345/156 |
| 2009/0021517 A1 * | 1/2009 | Foslien | ........................ | 345/440 |

* cited by examiner

*Primary Examiner* — Xiao M. Wu
*Assistant Examiner* — Todd Buttram
(74) *Attorney, Agent, or Firm* — Foley & Lardner LLP

(57) ABSTRACT

This invention facilitates monitoring operation for checking whether or not quality of a substrate deteriorates as well as operation for identifying a cause of deterioration in quality. Identification information of constituent elements related to measurement target sections (pads) on a component-mounted substrate is arranged into hierarchal structure data. A first axis is arranged with the measurement target sections associated with this arrangement. A second axis is arranged with information (identification information of lots and squeegees) representing production conditions of the substrates according to an order of the substrates being processed. A two-dimensional area defined by the first axis and the second axis is set. A color map is generated, in which measured data of the measurement target sections on the substrates are arranged in colors at corresponding positions within the two-dimensional area. Specifically, in the respective measured data, values in a preferable range is displayed in white, values larger than the preferable range is displayed in red-like color, and values smaller than the preferable range is displayed in blue-like color.

6 Claims, 18 Drawing Sheets

DATA STRUCTURE OF DESIGN CONDITION STORAGE UNIT

| PAD ID | TYPE OF COMPONENT | INDIVIDUAL PIECE ID | COMPONENT ID | PIN NUMBER |
|---|---|---|---|---|
| 1 | TRANSISTOR | AA | a | 1 |
| 2 | TRANSISTOR | AA | a | 2 |
| 3 | TRANSISTOR | AA | a | 3 |
| 4 | TRANSISTOR | AA | b | 1 |
| ... | ... | ... | ... | ... |
| 22 | TRANSISTOR | BB | b | 1 |
| 23 | TRANSISTOR | BB | b | 2 |
| 24 | TRANSISTOR | BB | B | 3 |

DATA STRUCTURE OF DISPLAY COLOR DEFINITION STORAGE UNIT

| MINIMUM | MAXIMUM | COLOR CODE |
|---|---|---|
| 0 | 50 | 0000ff |
| 50 | 60 | 3333ff |
| 60 | 70 | 6666ff |
| 70 | 80 | 9999ff |
| ... | ... | ... |
| 130 | 140 | ff6666 |
| 140 | 150 | ff3333 |
| 150 | ∞ | ff0000 |

DATA STRUCTURE OF PRODUCTION CONDITION STORAGE UNIT

| SUBSTRATE ID | LOT NUMBER | SQUEEGEE |
|---|---|---|
| 1 | 1 | FORWARD |
| 2 | 1 | BACKWARD |
| 3 | 1 | FORWARD |
| 4 | 1 | BACKWARD |
| ... | ... | ... |
| 38 | 4 | BACKWARD |
| 39 | 4 | FORWARD |
| 40 | 4 | BACKWARD |

DATA STRUCTURE OF MEASURED DATA STORAGE UNIT

| SUBSTRATE ID | PAD ID | MEASURED DATA |
|---|---|---|
| 1 | 1 | 74 |
| 1 | 2 | 75 |
| 1 | 3 | 80 |
| 1 | 4 | 67 |
| ... | ... | ... |
| 40 | 22 | 109 |
| 40 | 23 | 110 |
| 40 | 24 | 106 |

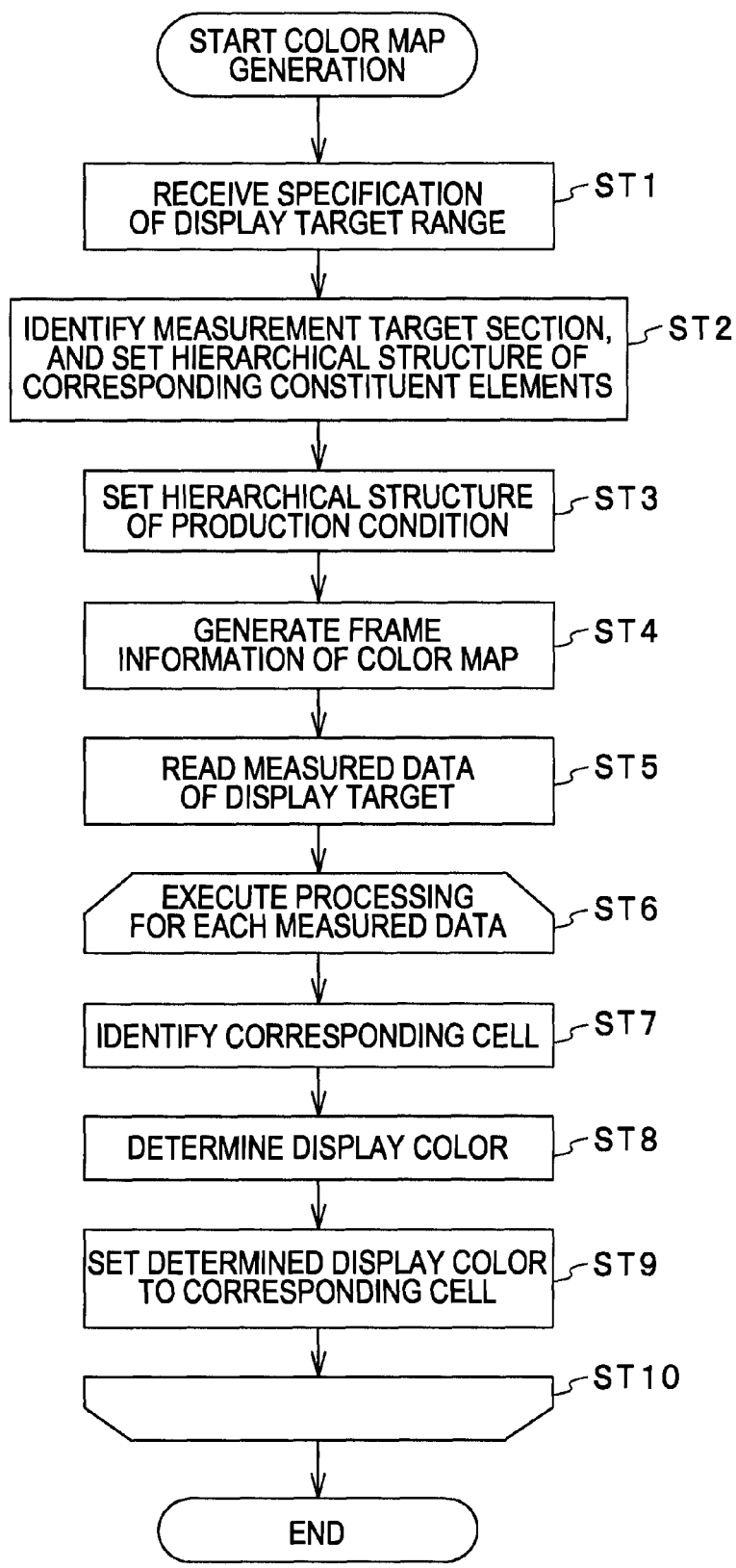

INFORMATION DISPLAY SYSTEM AND INFORMATION DISPLAY METHOD FOR QUALITY CONTROL OF COMPONENT-MOUNTED SUBSTRATE

BACKGROUND OF THE INVENTION

This application is based on Japanese Patent Application No. 2009-015930 filed with the Japan Patent Office on Jan. 27, 2009, the entire content of which is hereby incorporated by reference.

1. Technical Field

The present invention relates to a system for displaying information for quality control of a substrate produced in a production site of component-mounted substrates, and also relates to a method for displaying the information.

2. Related Art

Recent portable telephones and digital household appliances are smaller in size and have more and more functions. Accordingly, production of small substrates mounted with micro components with high-density is required in production sites of component-mounted substrates.

In such substrates, even a slight change in the supply of materials or the condition of jigs may deteriorate the quality of the substrates. Therefore, it is necessary to swiftly detect decrease in the precision of each process and find out a cause of the decrease.

In view of the above problem, Japanese Unexamined Patent Publication No. 2006-343152 describes a technique including the steps of measuring the amounts of solders printed at a plurality of positions of a plurality of substrates and displaying a histogram representing a frequency distribution of the measured values. Further, Japanese Unexamined Patent Publication No. 2006-71416 describes a technique including the steps of measuring the height, size, and volume of solders printed on a substrate and displaying a layout chart representing deviations between the measured values and reference values in such a manner that the levels are shown by a plurality of shades of gray.

Further, there is a method called stratified analysis, i.e., a quality control method widely employed at ordinary production sites. This method includes the steps of classifying constituent elements on a substrate (such as individual pieces, components, and electrodes) and productions conditions (such as lots, jigs, and time periods of production) into a plurality of conditions, making a graph of averages of measured values and unevenness for each condition, and comparing the graph in each condition. Then, when a difference of distribution is found between the graphs under a certain classified condition, an operation is carried out to find out specific cause, because the elements used in the classified condition are considered to have something to do with the decrease in the quality.

The decrease in the quality of a component-mounted substrate may be concentrated on a particular portion or a particular component, or may be not. In some cases, a time period in which the quality deteriorated can be identified, for example, such time period may be determined to be after the lot changes over or after a jig is replaced. But in other cases, the time period of the deterioration in the quality cannot be identified. In order to identify the cause of the deterioration in the quality in various circumstances as described above, it is necessary to understand both of variation of measured values within each substrate (hereinafter referred to as "variation within substrate") and variation of measured values between substrates (hereinafter referred to as "variation between substrates").

In the method described in Japanese Unexamined Patent Publication No. 2006-343152, measured values at a plurality of positions on a plurality of substrates are grouped and displayed as one histogram, and therefore, it is considered that neither the variation within substrate nor the variation between substrates can be recognized. In the method described in Japanese Unexamined Patent Publication No. 2006-71416, the variation within substrate can be recognized, but it is difficult to recognize the variation between substrates.

In a generally-used stratified analysis, the variation within substrate and the variation between substrates can be obtained by classifying a plurality of conditions. However, in order to narrow the reason of deterioration in the quality, it is necessary to arrange many classified conditions, and it may take a lot of time to identify the reason. Further, the stratified analysis is not suitable for checking whether there is any deterioration in the quality of products produced in a production line currently operating. Even if the stratified analysis is used for such purpose, it is difficult to efficiently perform check operation.

SUMMARY

It is an object of the present invention to facilitate monitoring operation for checking whether or not quality of a substrate deteriorates as well as operation for identifying a cause of deterioration in quality. Accordingly, in the present invention, both of variation within each of substrates and variation between the substrates can be checked at a time, and how non-preferable measured data appear in both of the variations is displayed in an easily recognizable manner.

A system according to the present invention is for displaying information for quality control of a component-mounted substrate that is produced in a production line, at least one process performed in the production line of the component-mounted substrate is adopted as a targeted process, and the system uses measured data obtained in an inspection performed after the targeted process. The system includes an attribute storage unit, an attribute input unit, a measured data input unit, a display information storage unit, a map image generation unit, and a display control unit.

The attribute storage unit stores, as an attribute of a measurement target section, a combination of identification information of constituent elements related to each of a plurality of measurement target sections included in one component-mounted substrate.

The attribute input unit inputs, as an attribute of a substrate, information representing a production condition of the targeted process performed on each of the substrates. The measured data input unit inputs the measured data obtained for each of the measurement target sections of the substrates in the inspection of the targeted process.

The display information storage unit stores display information, in which numerical values included in the measured data are classified into a preferable numerical range and a non-preferable numerical range and the non-preferable numerical range is displayed in a color or shade different from that of the preferable numerical range.

For example, this display information is considered to be a table in which the numerical ranges are associated with predetermined colors or shades. Alternatively, a function and a program for converting the measured data into the predetermined colors and shades may be used as the display information.

The map image generation unit generates a two-dimensional map image representing a distribution of the measured data upon setting a two-dimensional area and setting the color or shade to corresponding positions on the two-dimensional area. The two-dimensional area includes a first axis and a second axis. The identification information of the constituent elements stored in the attribute storage unit are arranged into a hierarchical structure based on relationship between the constituent elements, and the first axis is arranged with the measurement target sections associated with this arrangement. The substrates to be displayed are arranged into an order of the substrates subjected to the targeted process. The second axis is arranged with the identification information of the production conditions corresponding to the substrates in accordance with this order. The color or shade is obtained by applying the display information to the measured data that are input for each of the measurement target sections of the substrates. The display control unit displays, on a monitor apparatus, the generated two-dimensional map image.

In the above system, the attributes of the measurement target sections stored in the attribute storage unit represents how the measurement target sections are related to a configuration of a completed substrate. For example, when substrate electrodes (pads) are measured, the attribute storage unit can store, for each pad, a combination of identification information of a type of component connected to the pad, the component, and electrodes in the component.

The information input by the attribute input unit as the attributes of the substrates represents production conditions of the substrates such as a time period in which the process is performed, a lot number, identification information of jigs used in the targeted process (such as squeegees of a solder printer and a component feeder of a component mounting machine). Any information that changes according to processed substrates and according to the elapse of time can be employed as this information.

In the two-dimensional map displayed according to the present invention, the identification information of the constituent elements of the measurement target sections are arranged into a hierarchical structure, and the first axis is arranged with the measurement target sections associated with this arrangement. The substrates are arranged into an order in which the substrates are subjected to the process, and the second axis is arranged with the identification information of the production conditions corresponding to the substrates in accordance with this order. The measured data of the measurement target sections of the substrates are displayed in the color or shade corresponding to the measured values. Therefore, a user can easily understand the production conditions and the configuration on the substrate corresponding to the measured data.

The measured data in the non-preferable numerical range are displayed in a color or shade that is different from that in the preferable numerical range. Therefore, a user can easily determine whether there is any deterioration in the quality of the substrates by checking the number and presence/non-presence of indications representing this non-preferable numerical range. Further, where the quality is determined to deteriorate, it is possible to specifically identify the deterioration in the quality such as a defect occurring at a position corresponding to a particular constituent element on the substrate and a defect occurring in the substrate produced according to a specific production condition. The deterioration can be specifically identified by checking how the indications representing the non-preferable numerical range are distributed within the map.

In the above system according to a preferable aspect, the display information in the display information storage unit is defined such that a preferable numerical range A, a numerical range B whose value is larger than the numerical range A, and a numerical range C whose value is smaller than the numerical range A are displayed in different colors from each other, and the display information is defined such that, when values belonging to the numerical ranges B and C are displayed, a brightness of the displayed color decreases according to increase of a difference between a value to be displayed and the numerical range A.

According to the above aspect, the distribution of the measured data having values larger than the preferable numerical range and the distribution of the measured data having values smaller than the preferable numerical range can be recognized based on the distribution of colors that are set for each of them. In these colors, the constituent elements and the substrate whose quality has greatly deteriorated can be found out by focusing on a portion on which colors of especially low brightness (dark colors) are concentrated.

According to a more preferable aspect, the display control unit generates a substrate map image representing relationship between the measurement target sections and the constituent elements representing the attributes of the measurement target sections, and the substrate map image is displayed in proximity to the two-dimensional map image. Consequently, the relationship between the configuration of the substrate and the indications within the two-dimensional map can be visually recognized, and corresponding portions can be more easily recognized.

According to another preferable aspect, a plurality of processes included in the production line are adopted as target processes, the map image generation unit generates two-dimensional map images respectively for the target processes, the first axes of the two-dimensional map images being identical, and the display control unit displays, at a time, the two-dimensional map images of the targeted processes generated by the map image generation unit.

According to the above aspect, two-dimensional map images in a plurality of processes showing the same portion are displayed at a time. Therefore, a worker can compare the distribution patters of these two-dimensional map images and perform detailed analysis, thus being able to swiftly identify the process responsible for the deterioration in the quality of the substrate and the specific cause of the deterioration.

Alternatively, the above system may be configured such that information representing the production conditions and the measured data is input (this input may be off-line input or input by way of another apparatus) from the manufacturing apparatuses and the inspection apparatuses in the targeted process, so that the two-dimensional map images are generated and displayed. It should be noted that the display control unit is not limited to the one that directly controls display operation of the monitor apparatus. Display data of the two-dimensional map images may be sent to another apparatus, and the another apparatus may be caused to display the two-dimensional map images.

A method for displaying information according to this invention includes the following steps to be performed in advance: setting, as an attribute of a measurement target section, a combination of constituent elements related to each of a plurality of measurement target sections included in one component-mounted substrate; and classifying the measured data obtained in the measuring process into a preferable numerical range and a non-preferable numerical range, and setting display information for representing the non-preferable numerical range in a color or shade different from that of the preferable numerical range. The method further includes the steps of: inputting, as an attribute of a substrate, information representing a production condition of the targeted process performed on each of the substrates; inputting the measured data obtained for each of the measurement target sections of the substrates in the inspection of the targeted process; displaying, on a screen of a monitor apparatus, a two-dimensional map image representing a distribution of the measured data upon displaying a two-dimensional area and displaying the color or shade at corresponding positions on the two-dimensional area including a first axis and a second axis, in which the identification information of the constituent elements representing the attributes of the measurement target sections are arranged into a hierarchical structure based on relationship between the constituent elements, the first axis is arranged with the measurement target sections associated with this arrangement, the identification information of the substrates to be displayed are arranged into an order of the substrates subjected to the targeted process, and the second axis is arranged with the identification information of the production conditions corresponding to the substrates in accordance with this order, the color or shade being obtained by applying the display information to the measured data that are input for each of the measurement target sections of the substrates.

As described above, according to the present invention, the measured data of the measurement target sections of the substrates are represented in colors or shades in the two-dimensional area made with the first axis and the second axis, so that the measured data in the non-preferable numerical range can be easily recognized. The first axis arranged with the hierarchical structure made by various kinds of constituent elements of the substrate, and the second axis arranged with information representing the production conditions of the substrates associated with the order of the process of the substrates. Therefore, a user who sees this display can easily recognize whether there is any deterioration in the quality of the substrates and what kind of issues are occurring in relation to the deterioration in the quality, and the user can identify the cause of the deterioration in the quality in a short time.

BRIEF DESCRIPTION OF THE DRAWINGS

FIG. 7 is a view showing another example of a distribution pattern of a color map;

FIG. 9 includes tables showing an example of data structure of a production condition storage unit, a measured data storage unit, a design condition storage unit, and a display color definition storage unit, respectively;

FIG. 10 is a flowchart showing a procedure of color map generation processing;

DETAILED DESCRIPTION

Figure 1:
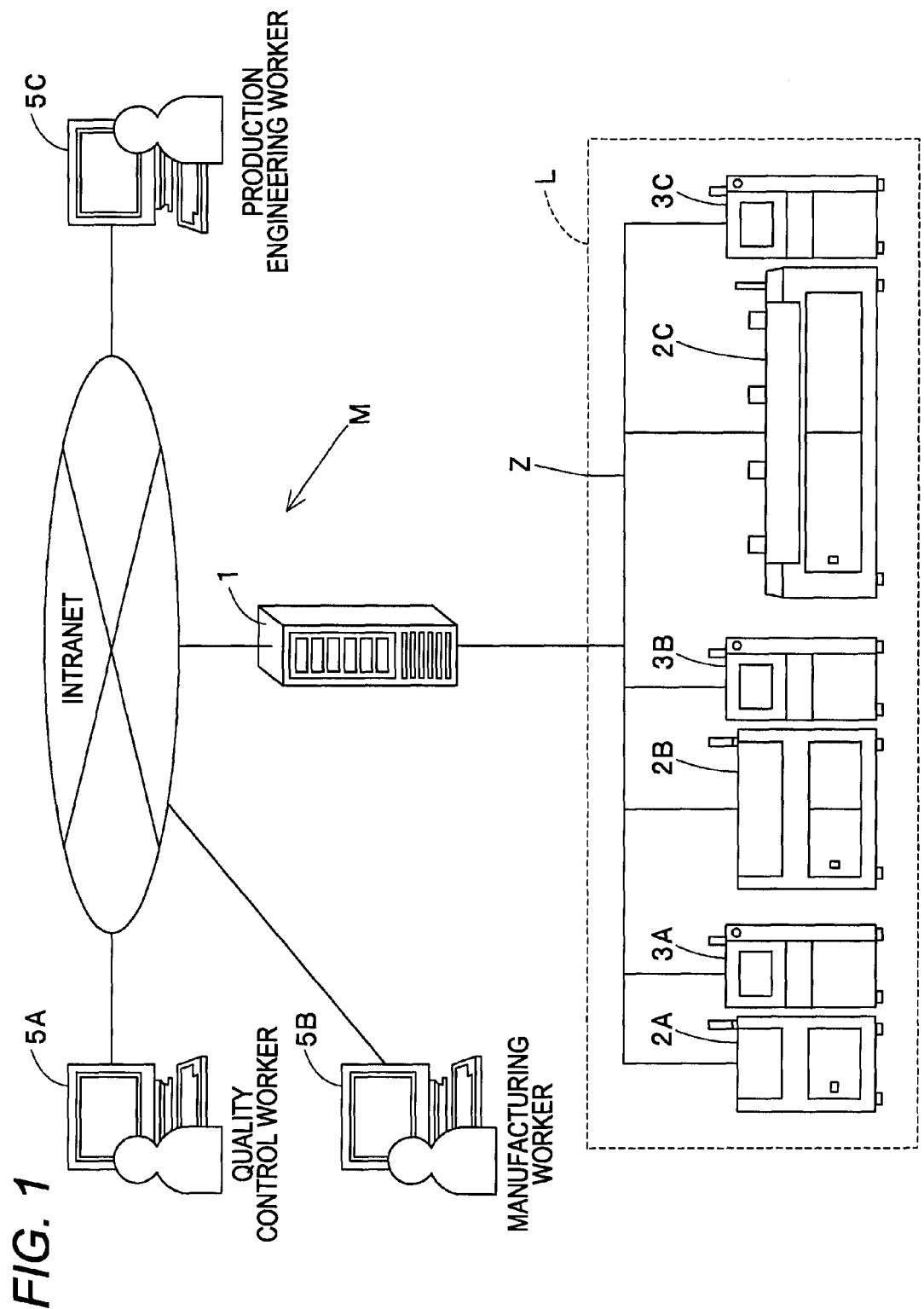
FIG. 1 is a view showing an example of configuration of a component-mounted substrate production line and a system for managing the quality of produced substrates.

FIG. 1 is an example of configuration of a component-mounted substrate production line L installed in a production site and a system M for managing the quality of produced substrates.

The substrate production line L includes three types of manufacturing apparatuses 2A, 2B, 2C and inspection apparatuses 3A, 3B, 3C respectively arranged at subsequent stages to the manufacturing apparatuses 2A, 2B, 2C. In the manufacturing apparatuses, the manufacturing apparatus 2A is a solder printer, the manufacturing apparatus 2B is a component mounting machine, and the manufacturing apparatus 2C is a reflow oven.

The inspection apparatus 3A performs three-dimensional measuring process using a stereo camera on a substrate having been subjected to the solder print process performed by the solder printer 2A, thus measuring the volume of solder printed on each pad on a substrate. Then, the inspection apparatus 3A compares each measured value with reference values registered in advance, so as to determine, for each pad, whether the amount of solder on the pad is appropriate, too much, or too little.

The inspection apparatuses 3B, 3C use a two-dimensional camera to taken an image and inspect external appearance through image processing. The inspection apparatus 3B determines whether each mounted component is correct or not and whether there is any positional displacement with respect to the substrate having been subjected to component mounting process performed by the component mounting machine 2B. The inspection apparatus 3C inspects a surface state of a solder fillet formed between a substrate-side pad and an electrode of each mounted component on the substrate having been subjected to reflow process performed by the reflow oven 2C.

The substrate quality control system M is made as a computer system including the server 1 and terminal apparatuses 5 used by workers of each division (in the drawings, three terminal apparatuses 5A, 5B, 5C are shown. But the number of apparatuses is not limited thereto.). In the computer system, the server 1 and the terminal apparatuses are connected with each other via an intranet. Further, the server 1 is connected to the manufacturing apparatuses 2A to 2C in the substrate production line L and the inspection apparatuses 3A to 3C, via a dedicated circuit Z.

Every time production of one substrate is finished, the manufacturing apparatuses 2A to 2C transmit, to the server 1, information representing conditions under which the process is performed on the substrate (hereinafter referred to as "production conditions") based on an operational definition set in advance. Every time inspection of one substrate is finished, the inspection apparatuses 3A to 3C transmit, to the server 1, the inspection result and measured data obtained through the measuring process executed for this inspection. Any information transmitted from any of the apparatuses is attached with identification information of a corresponding substrate (hereinafter referred to as "substrate ID"). Further the measured data transmitted from the inspection apparatuses 3C to 3C are attached with identification information of a corresponding measurement target section (for example, a pad ID which will be explained later).

The server 1 stores, to an internal memory (not shown), information transmitted from the manufacturing apparatuses 2A to 2C and the inspection apparatuses 3A to 3C and the attached identification information in such manner that the information is associated with the attached identification information. Further, when the server 1 receives, from the terminal apparatus 5, specification information input to the apparatus, the server reads, from the memory, information according to the specification, generates information for confirming the quality of the produced substrate, and transmits the information back to the terminal apparatus 5. The terminal apparatus 5 activates a confirmation operation screen on a monitor apparatus, based on this transmitted information.

A configuration of a confirmation screen and a process executed by the server 1 to generate this screen will be hereinafter explained. For example, in this explanation, a display is presented in order to confirm the precision of the solder print process performed by the solder printer 2A.

Figure 2:
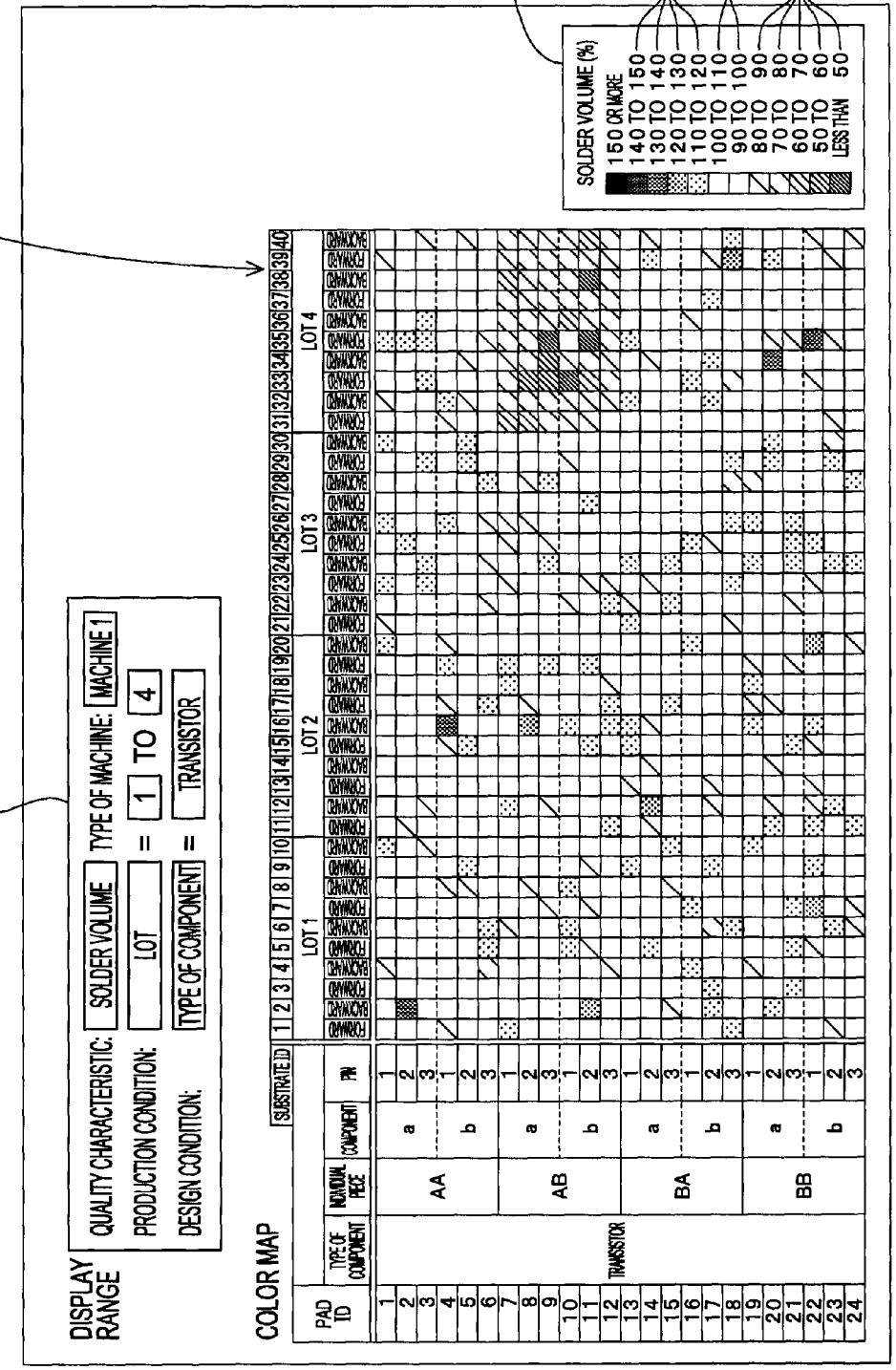
FIG. 2 is a view showing a basic configuration of a display screen of a color map.

FIG. 2 is an example of confirmation operation screen. In FIG. 2, the volume of solder measured by the inspection apparatus 3A is represented as a two-dimensional map 10 (hereinafter referred to as "color map 10") in which a plurality of colors are distributed. Not only in FIG. 2 but also in the following drawings of the color map 10, each color is represented by a dot pattern and a shaded pattern.

A display field 13 is arranged on a side of the color map 10 in this screen. In the display field 13, each color is associated with a numerical range represented by the color.

An input field 12 having a plurality of input boxes is arranged above the color map 10. This input field 12 is used to input the above-described specification information, and is left in the screen even after the color map 10 is displayed, so that the input field 12 can be used to confirm the specification information and can be used to specify a subsequent specification.

In this input field 12, "quality characteristic" means the type of the displayed measured data, and "type of machine" means a manufacturing apparatus to be displayed. "Production condition" means a condition occurring when solder print process is performed on each substrate, and is also used as a condition for narrowing substrates to be displayed. In this embodiment, substrates included in the range of lot numbers 1 to 4 are specified as display target.

"Design condition" means a condition relating to an arrangement of components and a circuit configuration of a component-mounted substrate. In this embodiment, "design condition" is used to mean inputting of a condition for narrowing target sections whose measured data are displayed. More specifically, a transistor, i.e., a particular type of component, is specified as a display target.

In the example of FIG. 2, in order to simplify the illustration, the number of substrates within each lot is assumed to be 10, and numbers 1, 2, 3, . . . are attached to the substrates as substrate IDs in the order of process. Further, numbers 1, 2, 3, . . . are attached to the measurement target section (pads) specified as display targets (hereinafter these are referred to as "pad IDs").

Figure 3A:
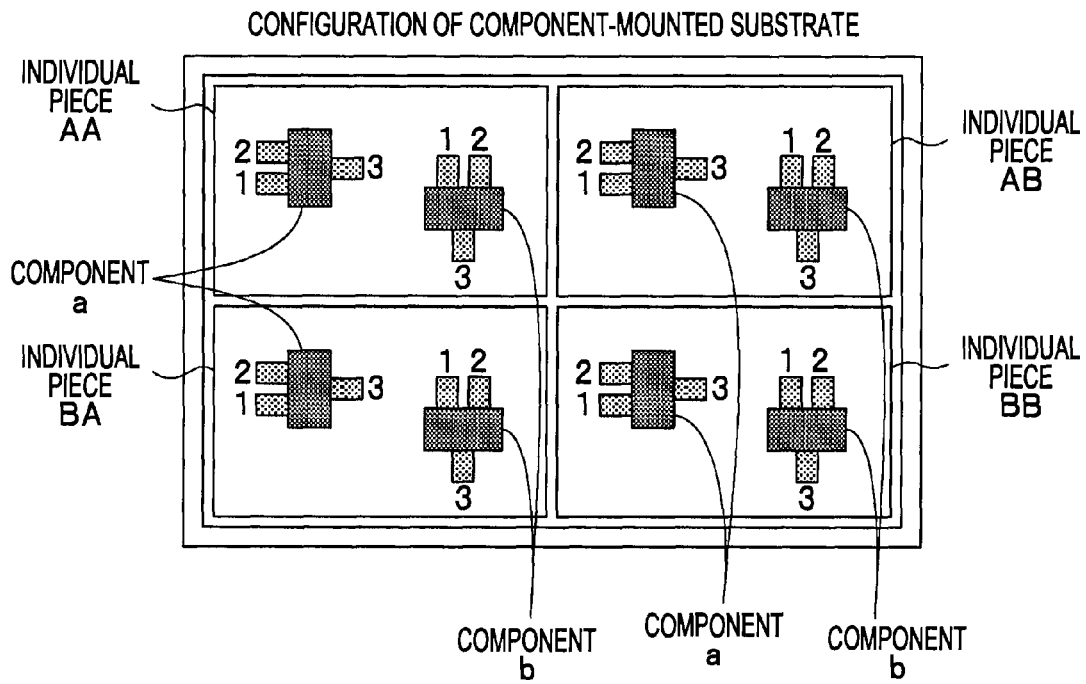
FIGS. 3A and 3B are schematic diagrams showing a configuration of a displayed substrate on which components are mounted and a configuration thereof before the components are mounted, respectively.
Figure 3B:
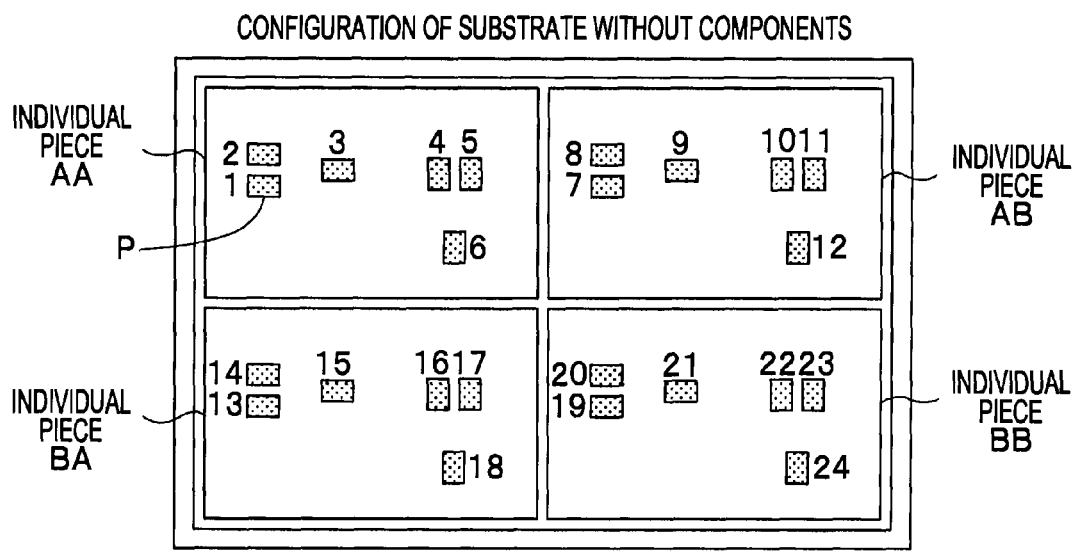

FIGS. 3A and 3B each show a substrate specified as a display target for the above-described color map 10. FIGS. 3A and 3B are schematic diagrams, which are compared with each other. FIG. 3A shows a configuration of the substrate on which components have been mounted, and FIG. 3B shows a configuration of the substrate before the components are mounted. In these schematic diagrams, the mounted components are limited to transistors specified by the design condition, and each component and each pad are drawn in such a manner that their sizes are exaggerated.

In the substrate according to this embodiment, four individual pieces are integrally formed. Each individual piece has the same type of mounted components and the same circuit configuration. The individual pieces are separated from each other after the substrate is completed, and each of the individual pieces is incorporated as a control circuit into a product. In this embodiment, each individual piece is mounted with two specified components (transistors).

In this embodiment, identification codes AA, AB, BA, BB are given to the individual pieces. Further, in any of the individual pieces, a left-side component is called "component a", and a right-side component is called "component b". Further, common numbers 1, 2, 3 (hereinafter referred to as "pin numbers") are attached to three electrodes that each of the components a and b has.

The schematic diagram of the substrate without components in FIG. 3B shows arrangement of 24 pads P corresponding to electrodes arranged on the components a and b on the individual pieces AA, AB, BA, BC. Numbers (1 to 24) respectively representing the pad IDs are indicated at a position in proximity to each pad P.

As described above, each pad P is identified by the pad ID, and can also be identified by a combination of identification codes of the individual piece, the components, and the electrodes of the component-mounted substrate. For example, the pad having the pad ID 1 is "a pad connected with the electrode having the pin number 1 of the component a of the individual piece AA", and the pad having the pad ID 13 is "a pad connected with the electrode having the pin number 1 of the component a of the individual piece BA." In other words, a combination of identification information of the individual piece, the component, and the electrode indicates a constituent element related to each pad P on the component-mounted substrate, and serves as information representing a content unique to each pad P.

The substrate without components includes solders printed on the pads P, which are not shown in FIGS. 3A and 3B. On the other hand, the component-mounted substrate includes not only the components and electrodes shown in the drawings but also pads P and fillets formed between a pad P and a component-side electrode.

Subsequently, the solder print process executed by the solder printer 2A according to this embodiment will be explained with reference to FIG. 4. Shown in the drawing are a substrate to be processed S and pad P.

When the solder printer 2A according to this embodiment receives a substrate S conveyed thereinto, the solder printer 2A places a mask MK having opening sections H corresponding to the pads P onto the upper surface thereof, providing a cream solder F thereon, and moves squeegees G1 and G2. In this case, when an odd-number substrate S is processed, the cream solder F is provided to the left end of the mask MK in the drawing, and the squeegee G1 on the left side is moved from left to right, so that solder print is performed on this substrate S. As a result of this process, the cream solder F that is not attached to the pads P is moved to the right hand of the mask M. Therefore, when a subsequent even-number substrate S is processed, the squeegee G2 on the right side is moved from right to left, so that the cream solder F is moved to left, and solder print is performed.

In this embodiment, the moving direction of the squeegee G1 is referred to as "forward direction", and the moving direction of the squeegee G2 is referred to as "backward direction". "Forward direction" and "backward direction" are represented by letters "F" and "B" that represent the moving directions of the squeegees G1 and G2, respectively.

The substrate production line L manages produced substrates in units of lots. Accordingly, when a substrate is conveyed into the solder printer 2A, i.e., the first manufacturing apparatus in the substrate production line L, a lot number of a corresponding lot and a process order within the lot (the order of the substrate within the lot) are attached to the substrate as production conditions.

Figure 4:
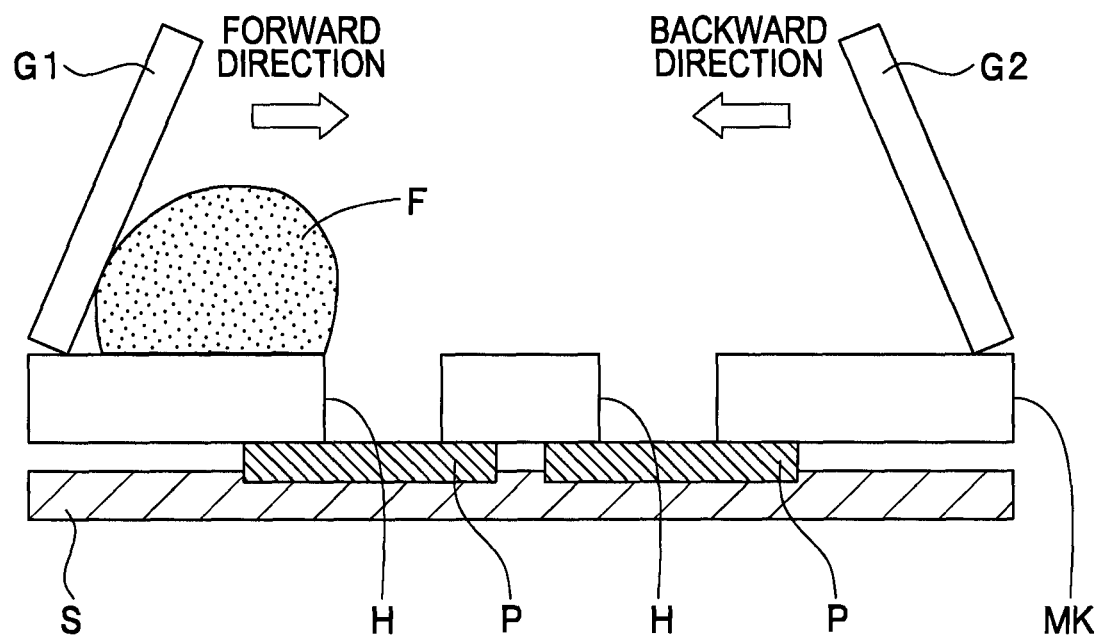
FIG. 4 is a schematic diagram showing contents of a solder print configuration.

Further, as shown in FIG. 4, since the solder printer 2A uses the two squeegees G1 and G2 alternately, a production condition indicating "which of the forward squeegee or the backward squeegee is used" is generated when the solder print process is performed on each substrate.

Every time the solder printer 2A processes one substrate, the solder printer 2A transmits, to the server 1, not only information representing the production conditions generated with respect to this substrate (lot number, process order, type of squeegee) but also the substrate ID of the substrate. The server 1 stores this information to the memory, and uses the information as attribute information when the color map 10 is generated.

Now, FIG. 2 is referenced again, and the explanation about the display screen of the color map 10 is resumed.

As shown in the display field 13 on the right end of this screen, in this embodiment, the measured values of solder volumes are converted into percent, the converted measured values are classified into a plurality of numerical ranges, and a color is assigned to each range. In this embodiment, 100% solder volume corresponds to an ideal value of solder volume defined by a user, and the range of 90 to 110% is represented in white color, meaning a preferable numerical range. In contrast, the range of 110% or more is represented in red-like color, meaning that the solder amount is too much. On the other hand, the range of 90% or less is represented in blue-like color, meaning that the solder amount is too little. Each of red-like color and blue-like color has five levels such that the farther the level is away from the preferable level, the lower the brightness becomes (brighter red or brighter blue).

The above preferable numerical range is determined according to a predetermined rule defined in advance, regardless of the range in which the inspection apparatus 3A determines that the substrate is non-defective. Therefore, some of the substrates that belong to the non-preferable numerical range, i.e., substrates whose solder volume is 110% or more and substrates whose solder volume is 90% or less, may include a substrate that is determined to be non-defective by the inspection apparatus 3A. On the contrary, depending on the configured rule, the preferable numerical range may correspond to non-defective range of the inspection apparatus 3A.

The boundary between the preferable numerical range and the non-preferable numerical range cannot be uniquely determined in terms of technology, but may vary according to users.

The color map 10 is arranged with 40 cells (the number of substrates) in the horizontal axis direction and 24 cells in the vertical axis direction, based on specified content. In the horizontal axis direction of the cells, the substrate IDs are associated in order. In the vertical axis direction, the pad IDs are associated in order.

Further, in the horizontal axis direction, the identification information of each lot, "lot 1", "lot 2", "lot 3", "lot 4" and the identification information of used squeegees, "forward" and "backward", are arranged in association with each substrate ID. The identification information serves as attributes representing production conditions generated when the solder print process is performed on each substrate. Further, since the identification information of the lot is common to a plurality of substrates and switches as time advances, the identification information of the lot is arranged as superordinate concept of the squeegee information.

In the vertical axis direction, information of the type of component, the individual piece, the component, and the electrode (PIN) representing attributes of each pad is displayed and arranged in hierarchical structure format based on actual relationship on the substrate. The order of arrangement of 24 pads in the vertical axis direction is actually not based on the pad ID, but is determined based on the arrangement of the hierarchical structure of the constituent elements of this substrate.

Each cell of the color map 10 displays a color representing measured data obtained with respect to the corresponding pad of the corresponding substrate. Therefore, the color pattern in the vertical axis direction represents variation, within the substrate, of the solder volume of each substrate. The color pattern in the horizontal axis direction represents variation, between the substrates, of 40 substrates.

According to the color map 10, when there are a few red-like or blue-like cells indicating non-preferable measured values, and these cells are not concentrated on a particular region, it is not necessary to perceive this as a problem. However, when the red-like or blue-like cells are widely distributed over the map, or when such cells are concentrated on a predetermined region in the map, the production conditions or the design condition of the substrate are considered to have some kind of defect, and it is necessary to analyze the cause. In this embodiment, the horizontal axis direction of the color map 10 is associated with the production conditions of the substrate, and the vertical axis direction is associated with a combination of constituent elements related to measurement target sections. Therefore, a cause of deterioration of the measured value can be easily estimated by checking display of each axis corresponding to a cell representing a non-preferable measured value.

In the color map 10 of the example of FIG. 2, in a region corresponding to the individual piece AB of the lot 4, there are many blue-like cells indicating that the solder amount is too little. In this case, some kind of defect is considered to have taken place in the solder print to the portion corresponding to the individual piece AB while the production of lot 4 is executed. Therefore, a cause of deterioration of the quality at this portion can be identified by checking the process content at the portion corresponding to the individual piece AB, so that further deterioration of the quality can be prevented.

As described above, in this embodiment, it is possible to easily recognize a region on which cells having non-preferable measured values are concentrated, based on the distribution pattern of colors within the map. Accordingly, based on the range of each axis corresponding to the region, it is possible to identify the production conditions of the substrate when the amount of solder becomes non-preferable, and identify the constituent elements connected to the pad whose solder amount is not preferable. Therefore, a cause of defect in the solder amount can be easily identified, and further, necessary steps can be taken before the condition of solder further deteriorates to result in many defects.

Figure 5:
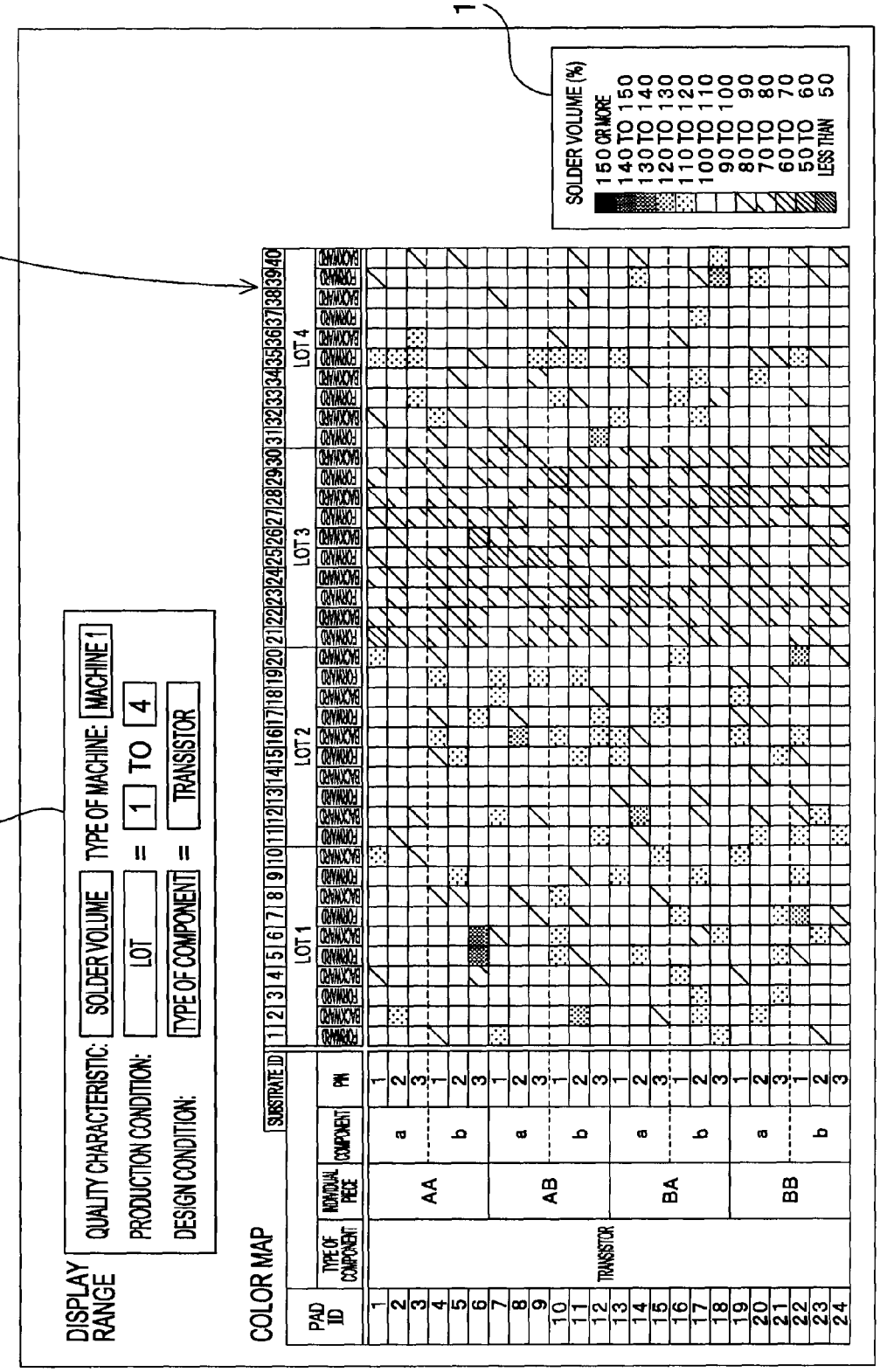
FIG. 5 is a view showing another example of a distribution pattern of a color map.
Figure 6:
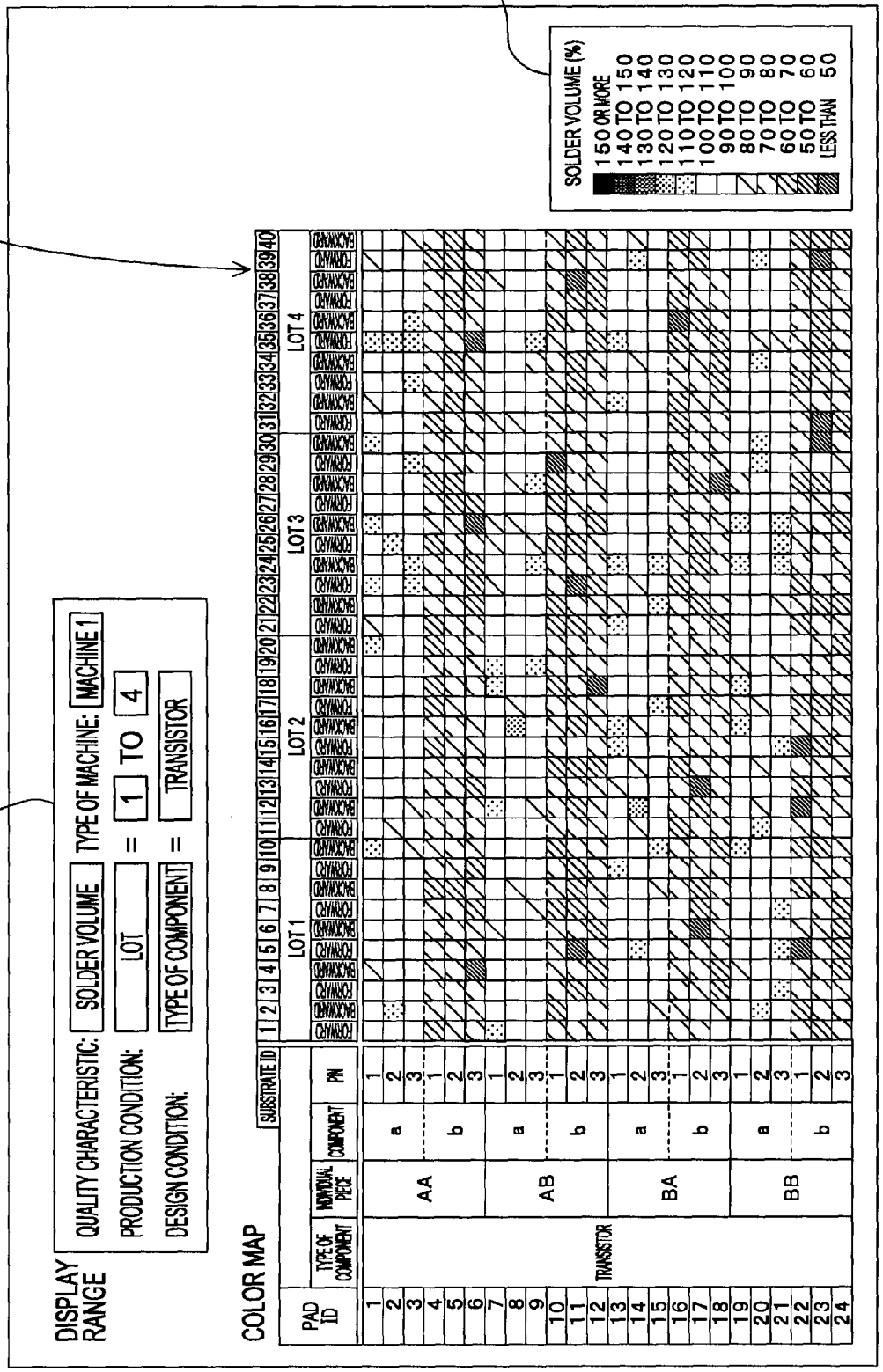
FIG. 6 is a view showing another example of a distribution pattern of a color map.
Figure 7:
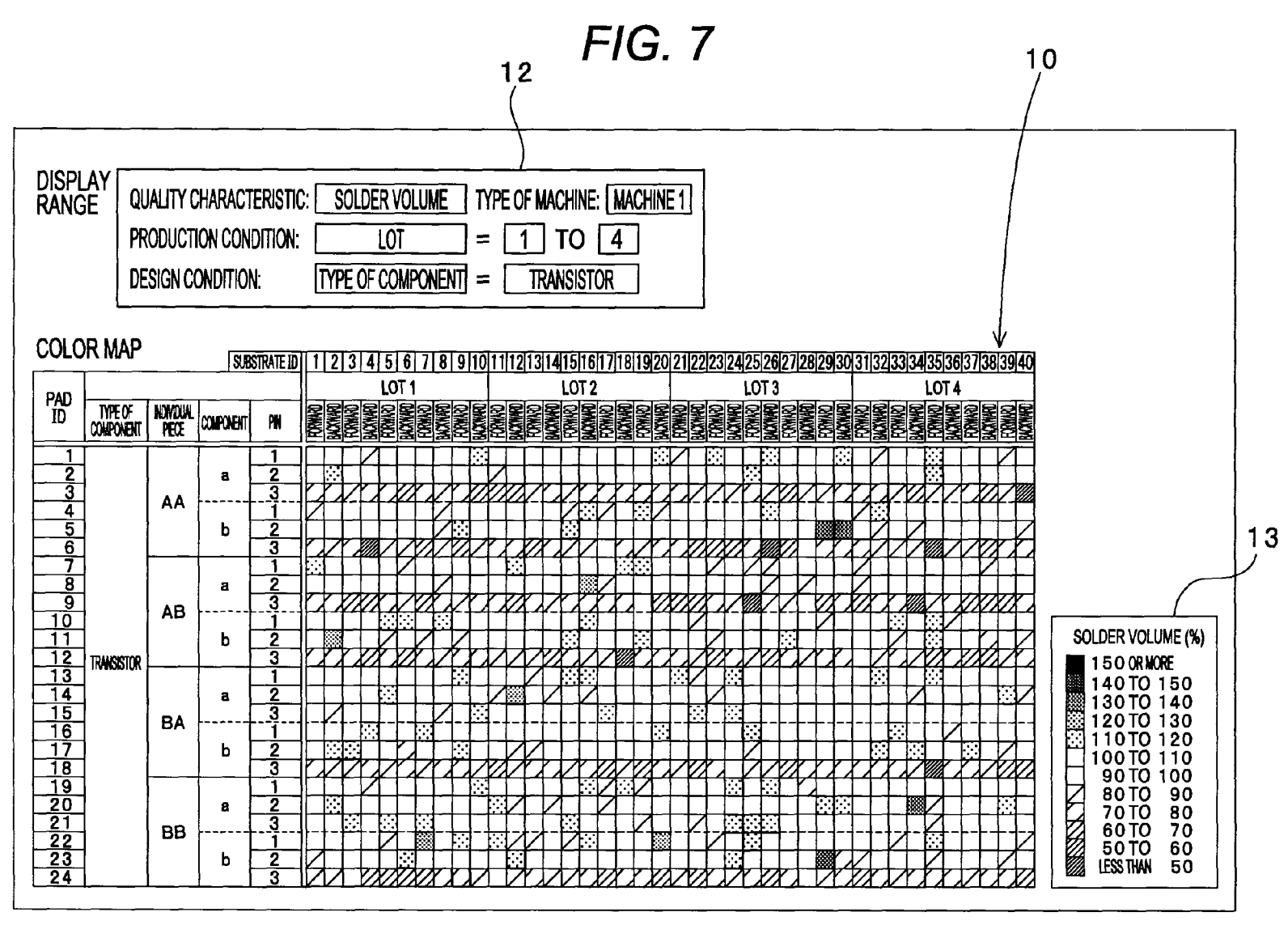

FIGS. 5 to 7 show other examples of distribution patterns of the color map 10. In the below, a cell having red-like or blue-like color is called "abnormal cell".

First, in the example of FIG. 5, abnormal cells are concentrated on a region corresponding to the lot 3. In the lot 3, the distribution of abnormal cells in the vertical axis direction appears to be random, and the abnormal cells appear to have no difference between the forward squeegee and the backward squeegee. In this kind of case, the reason why the number of pads whose solder amount is not preferable has increased can be identified by checking whether there is any production condition commonly applied to each substrate in the process of the lot 3 (for example, whether the lot 3 uses a mask different from that used in other lots).

Subsequently, in the example of FIG. 6, abnormal cells are concentrated in a region corresponding to the component b, regardless of the lot or the individual piece. Further, in the example of FIG. 7, abnormal cells are concentrated in a region corresponding to the electrode having the pin number 3 of the components a and b, regardless of the lot, the individual piece, or the component.

When the measured value of the pad corresponding to the particular constituent element on the substrate is not preferable just as the cases of FIGS. 6 and 7, there is a possibility that the production conditions are not in conformity with the design condition of the substrate. For example, when the size of the pad is small, the opening sections H of the mask H accordingly become small, but the small opening sections H reduce the passage characteristic of the cream solder. Therefore, the distribution pattern of abnormal cells as shown in FIGS. 6 and 7 may appear when a preferable amount of solder cannot be transferred because a particular component or an electrode pad is made small due to the relationship with surrounding components. However, the defect of the solder amount can be solved by reconsidering the production conditions in view of the characteristics of the substrate-side configuration, for example, by changing the mask to one having larger opening sections H.

The relationship between the pad and the configuration of the substrate cannot be readily estimated by simply indicating a portion having bad measured values with the identification information (pad ID) of each pad. Even if the causes as described above can be estimated, it takes much time to estimate the causes. In view of this problem, in this embodiment, a constituent element corresponding to the range on which abnormal cells are concentrated can be immediately found out. Therefore, a cause of deterioration of the solder amount can be easily determined.

Figure 8:
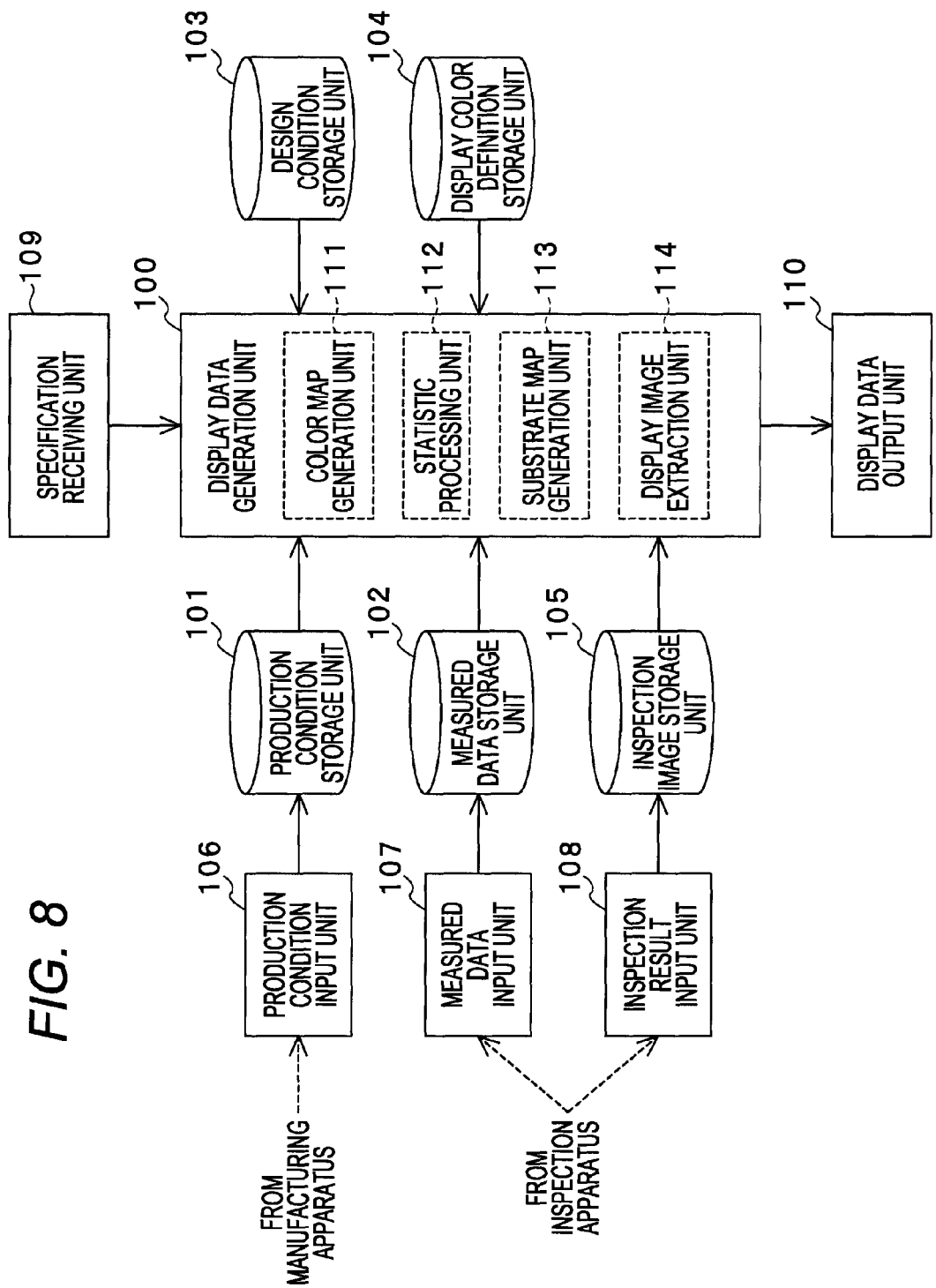
FIG. 8 is a block diagram showing functions arranged in a server.

FIG. 8 shows various functions arranged in the server 1.

In FIG. 8, storage units 101 to 105 are shown, which are actually a group of information stored in the memory of the server 1. In the storage units 101 to 105, the production condition storage unit 101, the measured data storage unit 102, the design condition storage unit 103, and the display color definition storage unit 104 show examples of data structure in FIG. 9 according to specific examples of FIGS. 2 to 4 explained above.

In addition to the above-described storage units, the server 1 is arranged with functions of a production condition input unit 106, a measured data input unit 107, an inspection result input unit 108, a specification receiving unit 109, a display data generation unit 100, and a display data output unit 110.

The production condition input unit 106 receives transmissions of information representing the production conditions of the substrates from the manufacturing apparatuses 2A, 2B, 2C, and stores the received information to the production condition storage unit 101. The measured data input unit 107 receives transmissions of the measured data obtained in the inspections performed on each substrate from the inspection apparatuses 3A, 3B, 3C, and stores the received information to the measured data storage unit 102. The inspection result input unit 108 receives transmissions of images used in the inspections from the inspection apparatuses 3A, 3B, 3C, and stores the received images to the inspection image storage unit 105.

The information stored in the design condition storage unit 103 is generated in advance based on design information of substrates, and is input to the server 1. The display color definition storage unit 104 is introduced to the server 1 together with programs for various functions shown in the drawings. Not only the data structure shown in FIG. 9 but also measured values of 100% (input by a user in advance), serving as reference values for converting the measured data into percent, are registered to the display color definition storage unit 104.

The terminal apparatus 5 receives a specifying operation relating to generation of the color map 10, and the specification receiving unit 109 receives the specified content from the terminal apparatus 5.

The display data generation unit 100 includes a color map generation unit 111, a statistic processing unit 112, a substrate map generation unit 113, and a display image extraction unit 114. In these units, the color map generation unit 111 reads necessary information from the production information storage unit 101, the measured data storage unit 102, the design condition storage unit 103, based on information received by a specifying operation receiving unit 109, and generates image data of the color map 10. At this occasion, the color of each cell of the color map 10 is derived by applying the definition of the display color definition storage unit 104 as shown in FIG. 9 to a value obtained by converting the value of the measured data corresponding to the pad and the substrate corresponding to the cell into percent based on the above reference value.

The statistic processing unit 112 and the substrate map generation unit 113 respectively generate a management graph 14 and a substrate map 15, which are display on screens according to the second and subsequent embodiments explained later. The display image extraction unit 114 executes process for reading an image of a section corresponding to a predetermined cell in the color map 10 from the inspection image storage unit 105.

Figure 11:
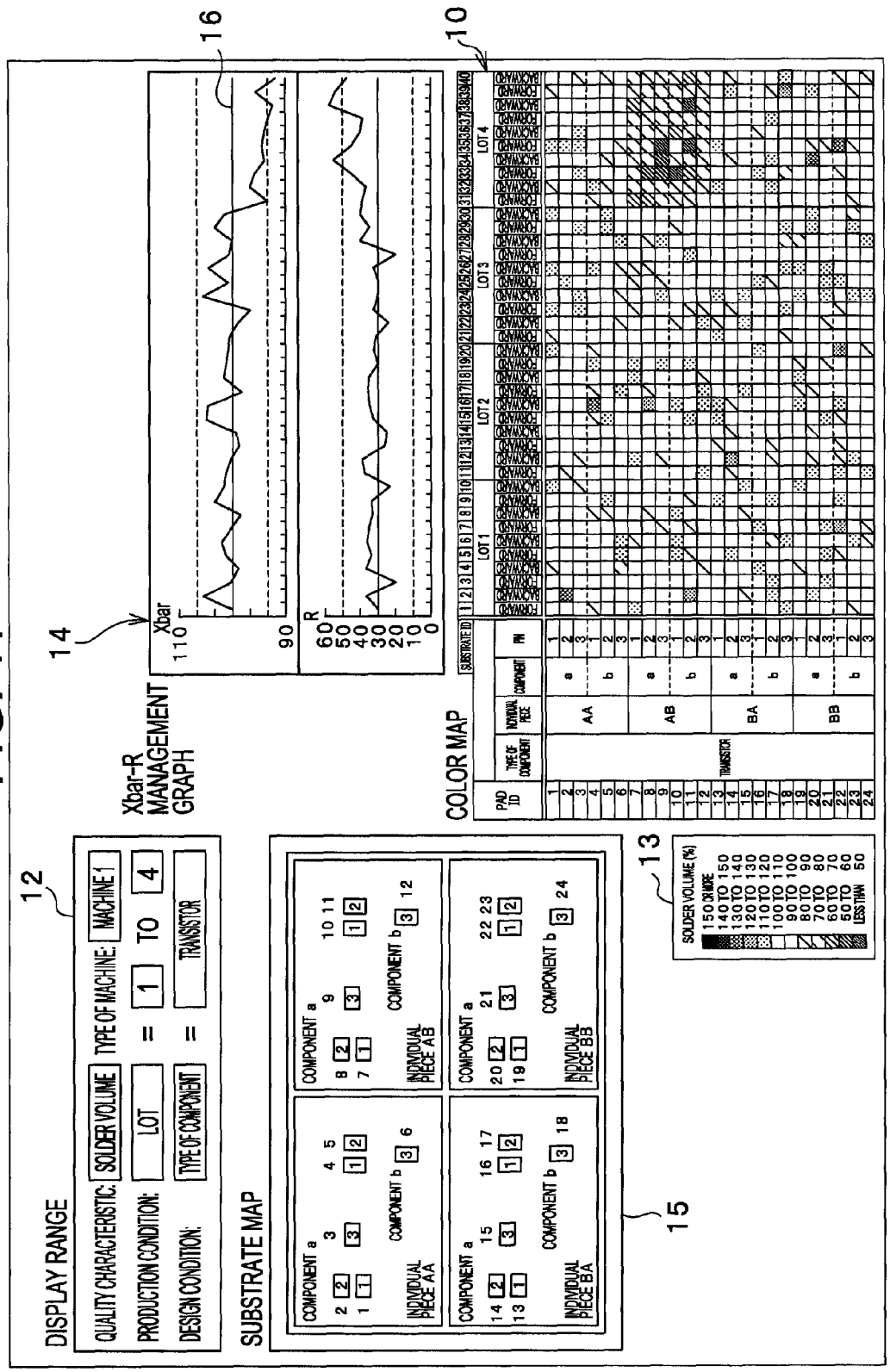
FIG. 11 is a view showing another example of a display screen of a color map.

The display data output unit 110 transmits, to the terminal apparatus 5, various kinds of information generated by the display data generation unit 100. The terminal apparatus 5 uses the transmitted information to activate, on a monitor apparatus of the terminal apparatus 5, a screen as shown in the examples of FIG. 2 or FIG. 11 and subsequent drawings.

FIG. 10 shows a procedure of process of the above functions that is executed by the color map generation unit 113. Hereinafter, the color map 10 having the configuration as shown in FIG. 2 is assumed to be generated, and the explanation will be made with reference to FIGS. 8 and 9 as necessary.

In the first step ST1, an operation for specifying the display target range with the color map 10 is received from the specifying operation receiving unit 109. More specifically, various kinds of information shown in a display field 12 of FIG. 2 are received.

Subsequently, in step ST2, the design condition storage unit 103 is searched based on information in the received information that is input as "design condition" (transistor), so that the identification information (individual piece ID, component ID, pin number, pad ID) subordinate to this information is read out. Then, the pad in the measurement target section is identified based on the pad ID of the identification information, and the hierarchical structure data of the constituent element corresponding to the measurement target section is set based on the other four kinds of information.

Subsequently, in step ST3, the production condition storage unit 101 is searched based on the information input as "production condition" (lots 1 to 4), so that the substrate ID corresponding to this information and the subordinate production condition (squeegee direction) are read out, and the hierarchical structure data of the production condition in conformity with the order of the substrate ID is generated.

In step ST4, the pad ID, the substrate ID, and the hierarchical structure data generated in steps ST2 and ST3 are used to generate framework information of the color map 10. In step ST5, the measured data storage unit 102 is searched based on the combinations of the pad ID and each substrate ID, so that the measured data to be displayed is read out. Then, the loop from step ST6 to step ST 10 is executed for each of the measured data.

In this loop, first, a corresponding cell in the color map 10 is identified based on the corresponding substrate ID and the pad ID (ST7). Subsequently, the display color definition storage unit 10 4 is searched based on the value of the measured data, so that the display color of the measured data is decided (ST8), and the display color is set to the corresponding cell (ST9).

The image data of the color map 10 generated as a result of the above procedure is given to the display data output unit 11. The image data is transmitted from the display data output unit 110 to the terminal apparatus 5. Therefore, the screen as shown in FIG. 2 is displayed on the monitor screen of the terminal apparatus 5.

The embodiments (the second to sixth embodiments) of display screens whose functions are further improved based on the color map 10 as shown in FIG. 2 will be hereinafter explained. In the below explanation, the added functions will be mainly explained. In any of the embodiments, the same elements are attached with the same reference signs, and the description about the elements explained in the previous embodiment is either not provided or simplified.

<Second Embodiment>

A screen of FIG. 11 showing this embodiment includes not only the color map 10 but also an Xbar-R management graph 14 of measured values and a substrate map 15.

The Xbar-R management graph 14 is generated by obtaining, for each substrate, an average value Xbar of the measured data and a difference R between the maximum value and the minimum value, and showing them as a time-series graph. The data of this graph is generated by the statistic processing unit 112 of FIG. 8, and the scale of the horizontal axis is arranged to correspond to the color map 10.

The substrate map 15 includes the layout chart of the substrate without components (the layout of the individual pieces and the pads) that is associated with the identification information of other constituent elements. The substrate map generation unit 113 of FIG. 8 generates data used to display this substrate map 15.

In the Xbar-R management graph 14, a reference line 16 in the center of the graph of the average value Xbar is associated with the measured value at 100%. The difference R between the maximum value and the minimum value increases when the variation of the measured data within the substrate increases. Therefore, a worker looks at a portion in which the Xbar value is greatly different from the reference line 16 and a portion in which the value R is large, and knows a process period in which the solder print precision is low, so that the worker can focus on checking the distribution of the color map 10 during that period.

According to the substrate map 15, the state of the pads in relation to the elements of the substrate can be correctly recognized based on the actual positions and directions of the pads and the identification information of the components and the electrodes. Therefore, when an abnormal cell appears in the color map 10, it is possible to easily identify in which range of the substrate the pads corresponding to the cell and the constituent elements corresponding to the pad are located.

<Third Embodiment>

Figure 12:
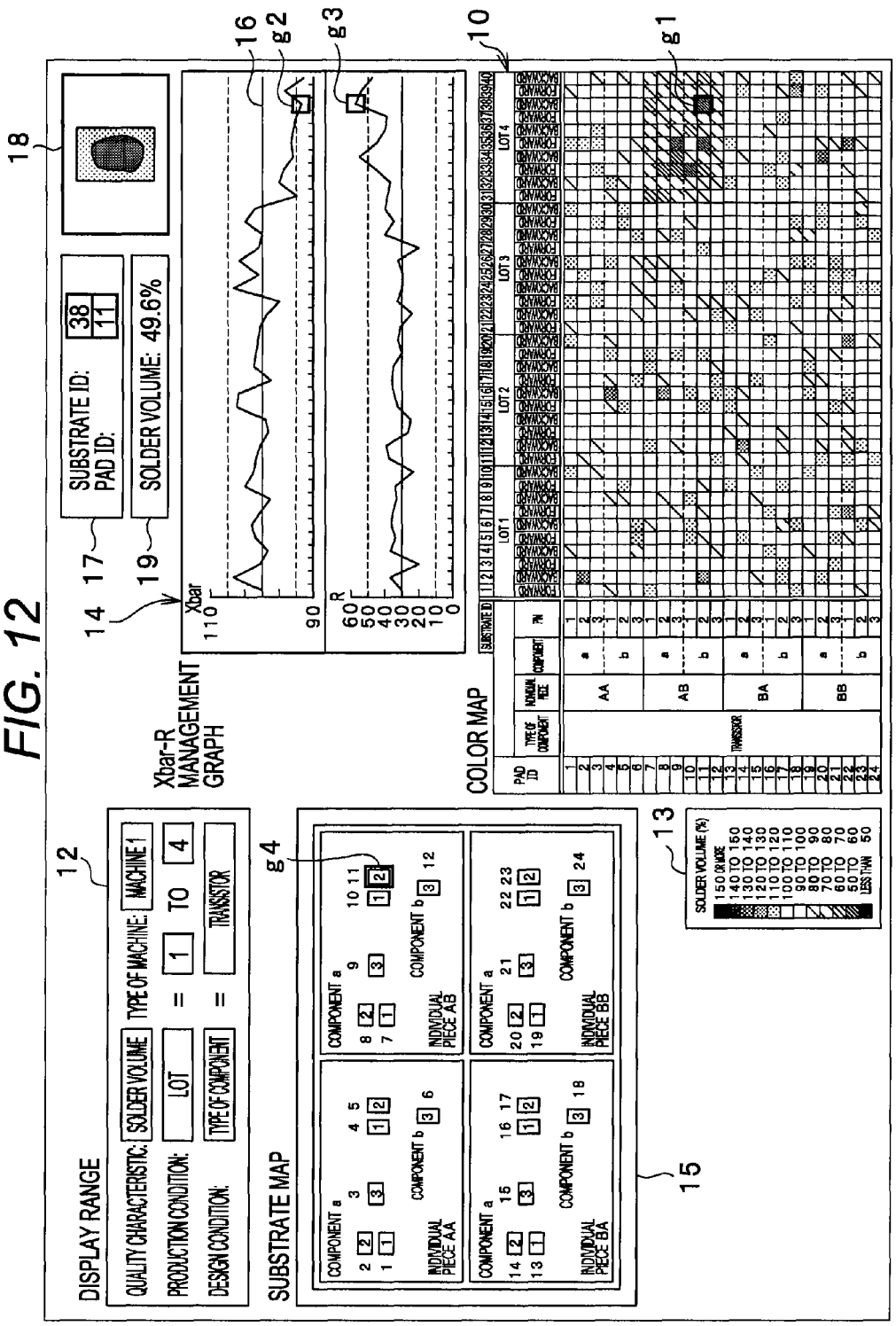
FIG. 12 is a view showing another example of a display screen of a color map.

A screen shown in FIG. 12 includes not only the configuration of the second embodiment but also an input field 17 for specifying any one of the displayed pads with corresponding substrate ID and pad ID, a display field 18 showing an image of the pad specified by the input field 17, and a display field 19 showing measured data of the pad. In the color map 10, the Xbar-R management graph 14, and the substrate map 15, the portions corresponding to the input IDs are indicated by frame mars g1 to g4 in predetermined colors. The image in the display field 18 is read out by the display image extraction unit 114 of FIG. 8.

According to the above configuration, a worker confirms a region on which abnormal cells in the color map 10 are concentrated, and thereafter selects one of the pads corresponding to this region, so that the worker can see the actual image and the measured data of the pad. Further, the position and the direction of the selected pad can be visually recognized based on the frame mark g4 on the substrate map.

The process for specifying the pad to be displayed may also be performed by clicking a corresponding cell in the color map 10. In this case, according to click operation, the display of the input field 17 is also switched to the pad having the ID corresponding to the operated cell.

Alternatively, when the screen is activated, the pads to be displayed may be automatically extracted from the range in which there are many abnormal cells, and the image and the measured data thereof may be displayed. Thereafter, as necessary, the display may be switched according to user's selection.

<Fourth Embodiment>

Figure 13:
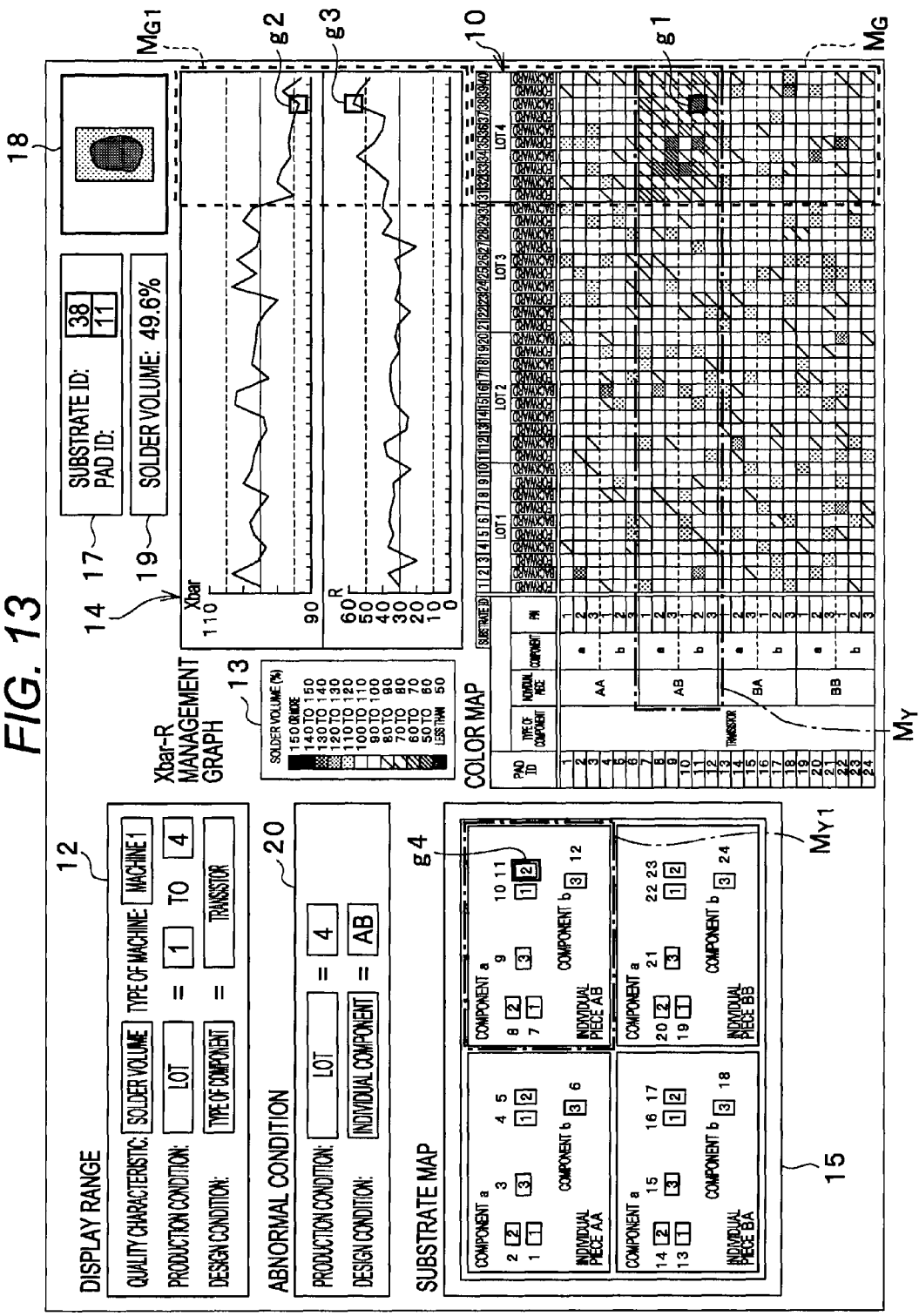
FIG. 13 is a view showing another example of a display screen of a color map.

A screen shown in FIG. 13 includes not only the configuration of the third embodiment but also an input field 20 for specifying the range on which abnormal cells are concentrated in the color map 10. In the input field 20, "production condition" is used to specify the attribute of the horizontal axis direction of the color map 10, "design condition" is used to specify the attribute of the vertical axis of the color map 10. In this example, the range corresponding to the substrate of the lot 4 is specified in the horizontal axis direction, and the range corresponding to the individual piece AB is specified in the vertical axis direction.

When the above specification is made, the specified range in each axis direction of the color map 10 is indicated by frame marks MY and MG in predetermined colors. Also in each of the Xbar-R management graph 14 and the substrate map 15, the frame marks MG1 and MY1 are set to the range corresponding to the specified range. Regarding these frame images, the frame marks MG and MG1 corresponding to the specified production conditions are displayed in green, and the frame marks MY and MY1 corresponding to the specified design condition are displayed in yellow colors.

According to the above arrangements, when a worker compares the portions indicated by the frame marks, the worker can easily understand a relationship between the abnormal range recognized in the color map 10 and the Xbar-R management graph 14 as well as the constituent elements of the substrate and the production conditions corresponding thereto.

In these embodiments, an operation for specifying the range of the color map 10 can be performed without inputting the input field 20. Further, the range on which abnormal cells are concentrated can be automatically extracted, and the frame marks can be accordingly displayed.

<Fifth Embodiment>

Figure 14:
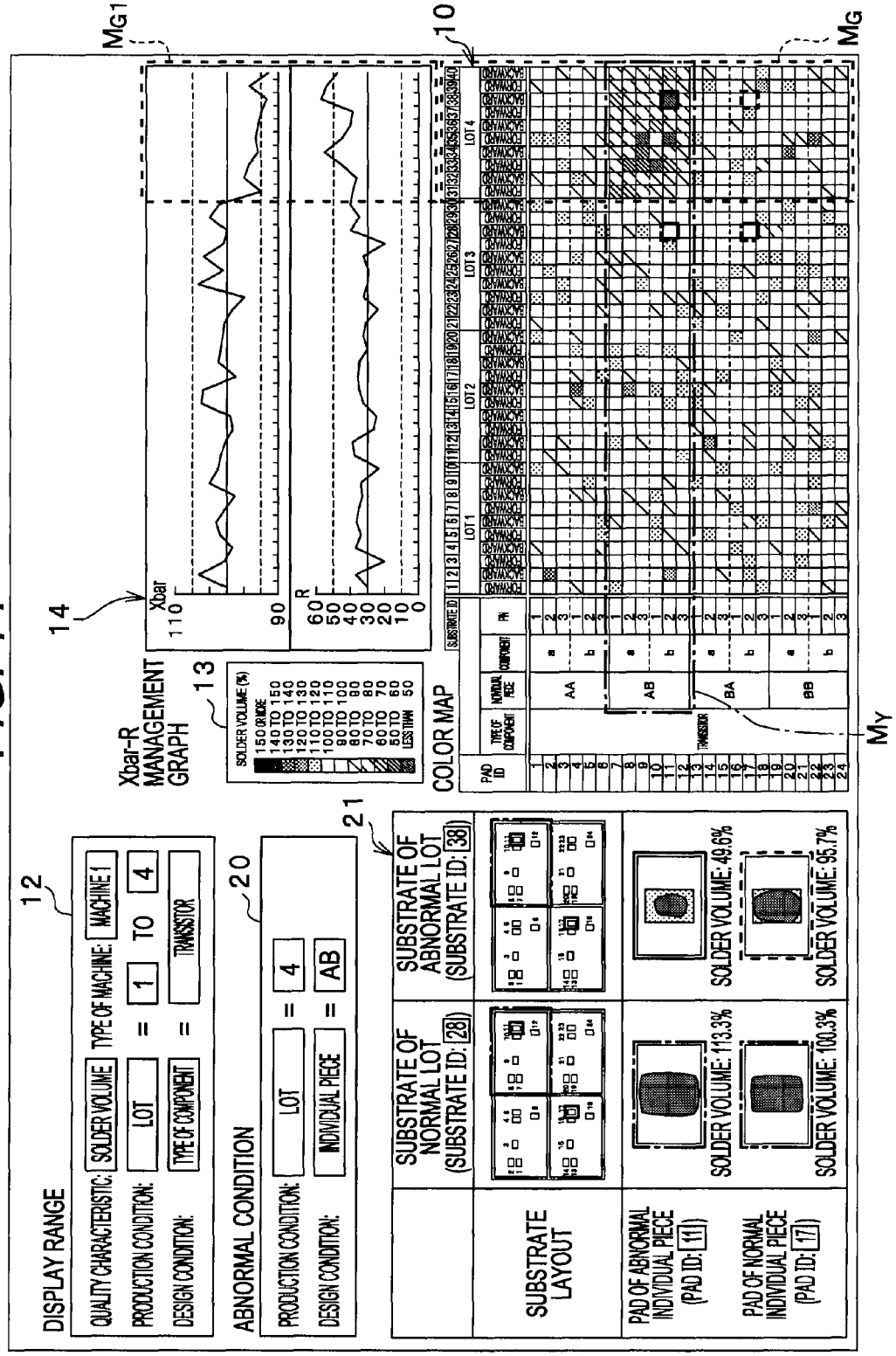
FIG. 14 is a view showing another example of a display screen of a color map.

A screen shown in FIG. 14 is arranged with a display field 21 instead of the substrate map 15 and the display fields 18 and 19 in the above embodiments. The display field 21 comprehensively includes the concepts of all of the substrate map 15 and the display fields 18 and 19. Further, the input field 20 similar to that of the fourth embodiment receives a specification of the range on which abnormal cells are concentrated, and four cells are selected in and out of the specified range, based on the specification. Then, the information about these cells are displayed in the display field 21.

More specifically, this will be explained with reference to FIG. 14. In this embodiment, an abnormal cell at a position having a substrate ID 38 and a pad ID 11 is selected from the specified range (the method for selection may be either click operation or automatic selection.).

According to the color map 10, the selected abnormal cell is on the individual piece AB of the 8th substrate processed in the lot 4, and corresponds to the pad connected to the electrode having a pin number 2 of the component b. Further, in this embodiment, a cell (i.e., the pad having an ID 17) corresponding to an electrode having the pin number 2 of the component b on the individual piece BA that is different from the selected one is selected from cells having the same substrate ID. Further, a substrate ID 28 outside of the range specified in the input field 20 is selected, and cells having the same pad IDs (11, 17) as the cells selected with respect to the substrate ID 38 are selected from cells corresponding to this substrate ID. These selection may also be automatically made based on the production condition of the measured data, the design information, and the production condition of the substrate, or may be made according to selection operation.

The display field 21 displays actual images of the pads corresponding to the selected cells, the measured data thereof, and the substrate maps of the substrates. Further, the pads in the images and the substrate maps and the selected cells in the color map 10 are indicated by frame marks (reference signs not provided) in colors, such that corresponding ones are indicated in the same color.

The substrate having the ID 38 and the substrate having the ID 28 have the same production condition in that both are processed as the eighth substrate within each lot and that the backward squeegee is used. Therefore, the worker can perform detailed analysis operation by collating the image and the measured data with those of the pads having the same production condition and the same relationship of the constituent elements.

<Sixth Embodiment>

Figure 15:
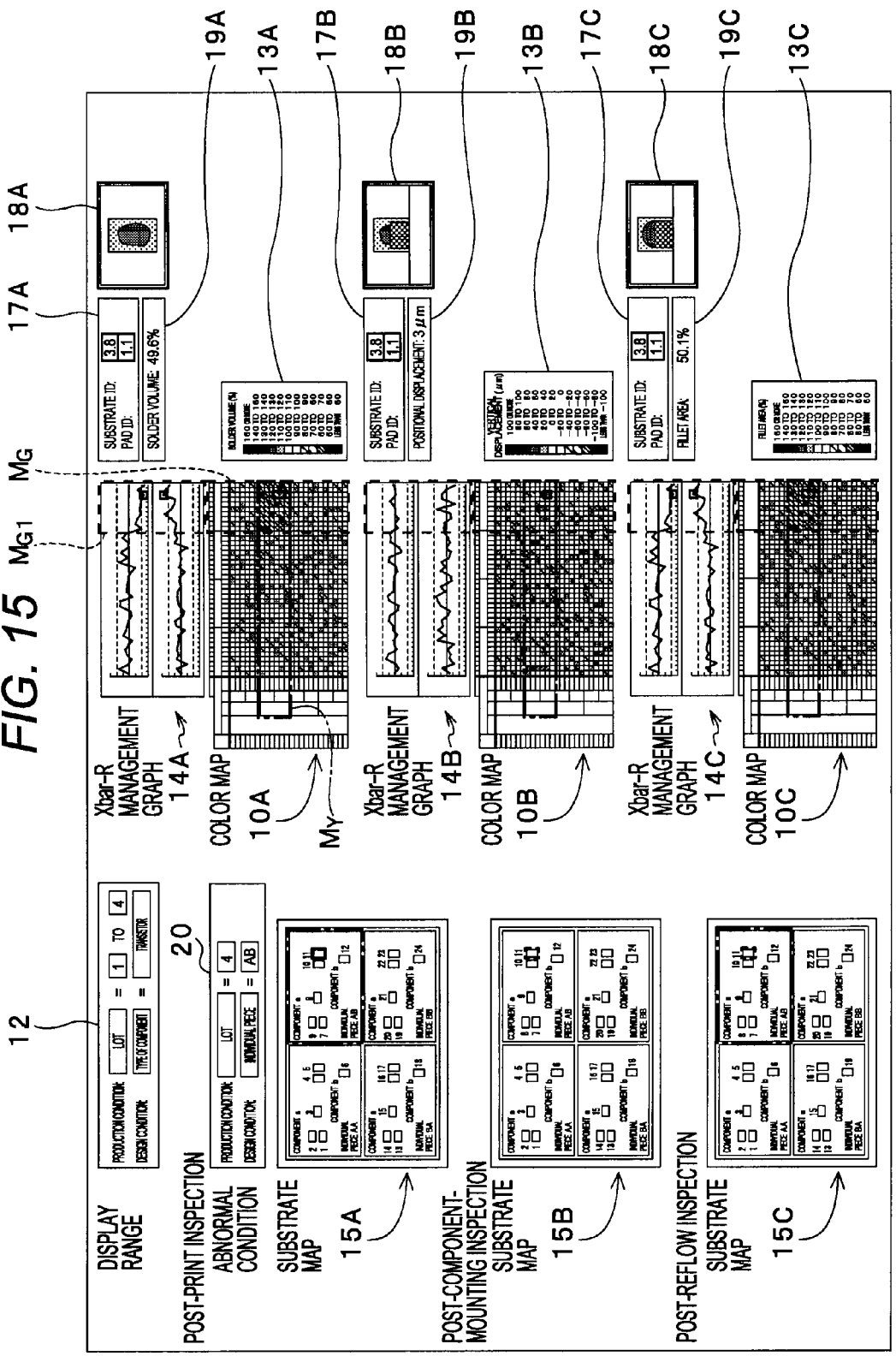
FIG. 15 is a view showing a screen configuration for collating color maps of processes.

FIG. 15 shows an example where similar information is generated with respect to not only the above-described solder print process but also the component mounting process and the reflow process and the generated information is arranged in one screen. The reference signs in the drawing are based on those in FIGS. 11 to 13. However, suffixes A, B, C are attached to reference signs of the same content so as to distinguish them from each other.

Figure 16A:
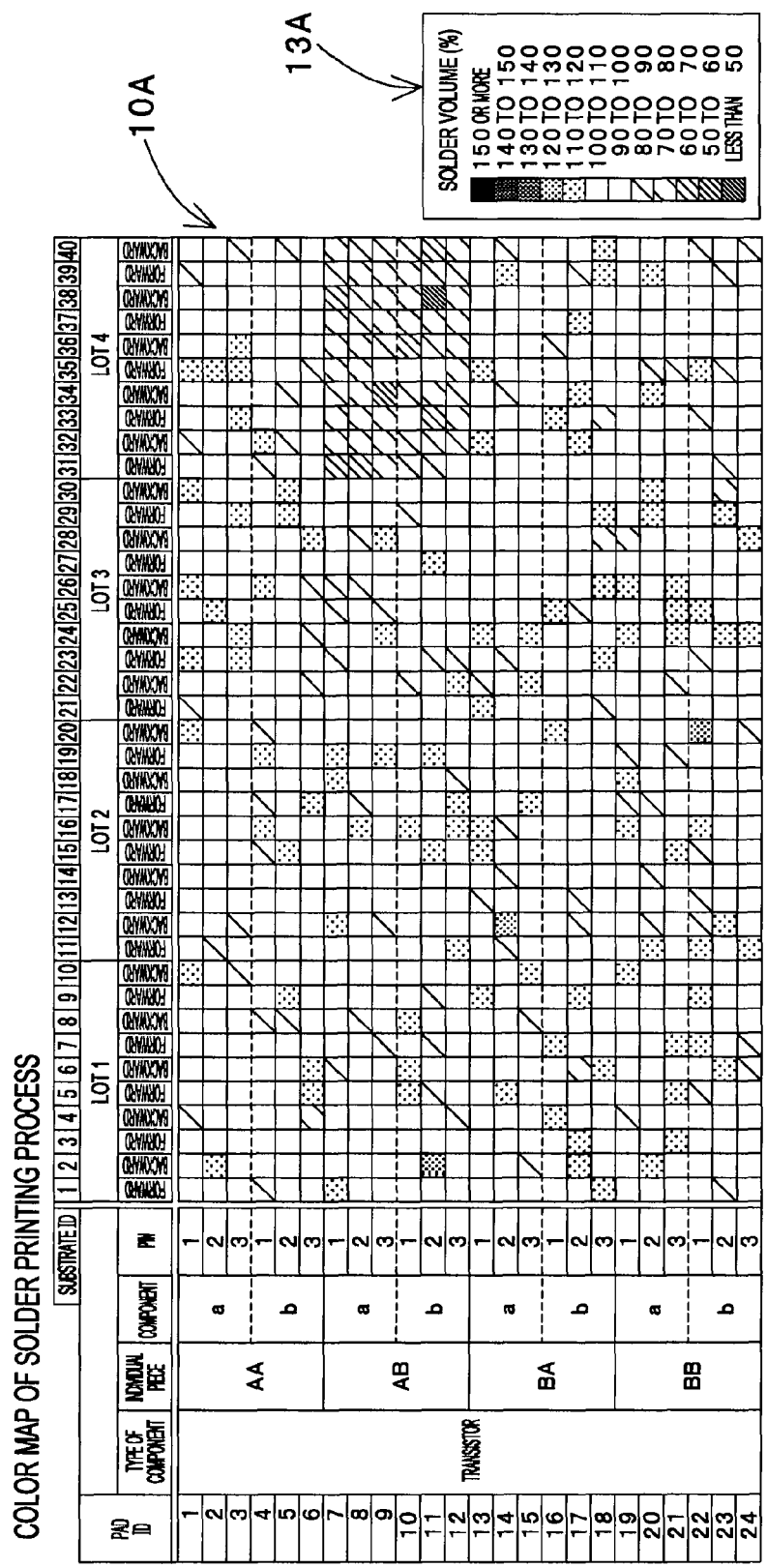
FIGS. 16A to 16C are views extracted from the screen of FIG. 15, and showing color maps and correspondence display fields showing correspondence between colors and measured data.
Figure 16B:
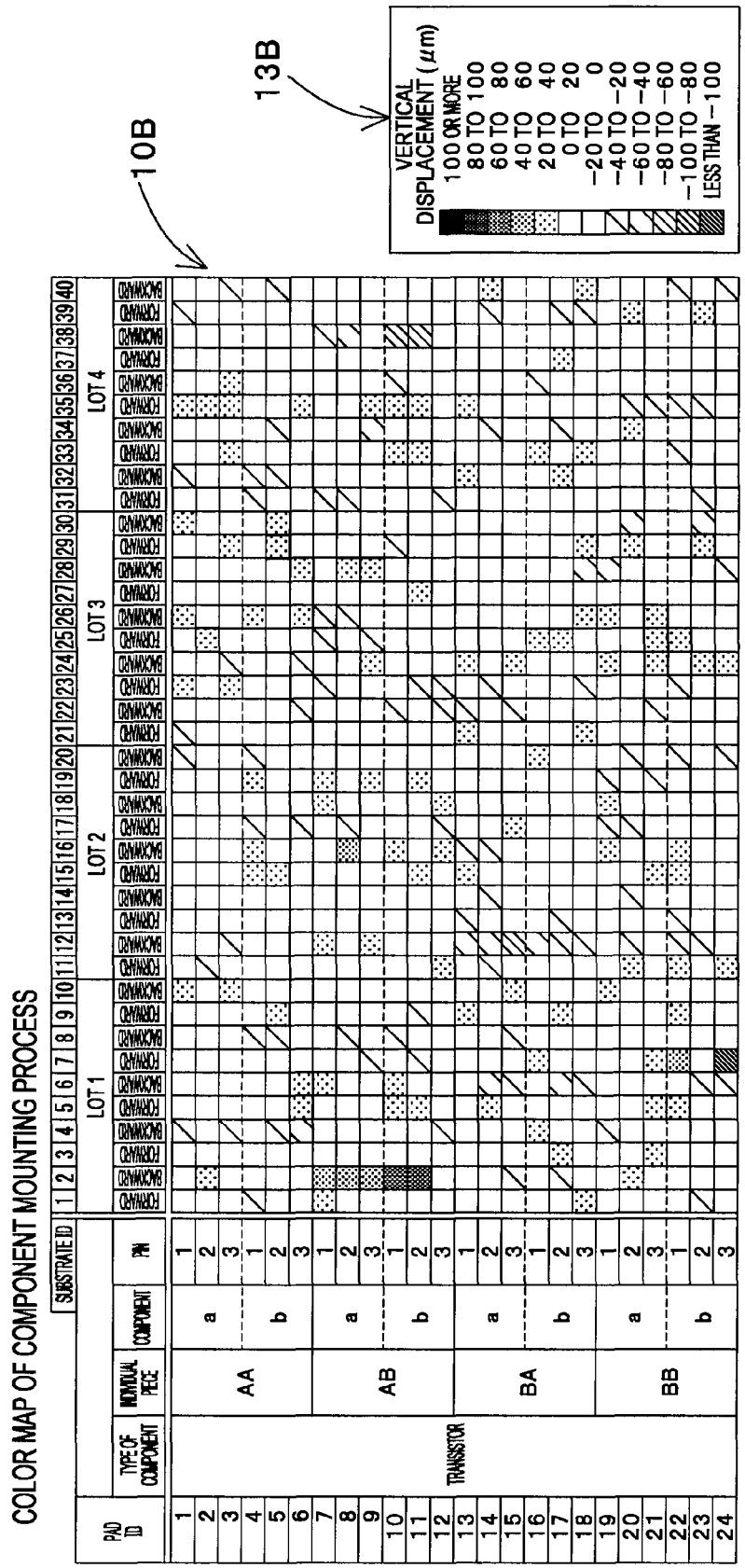
Figure 16C:
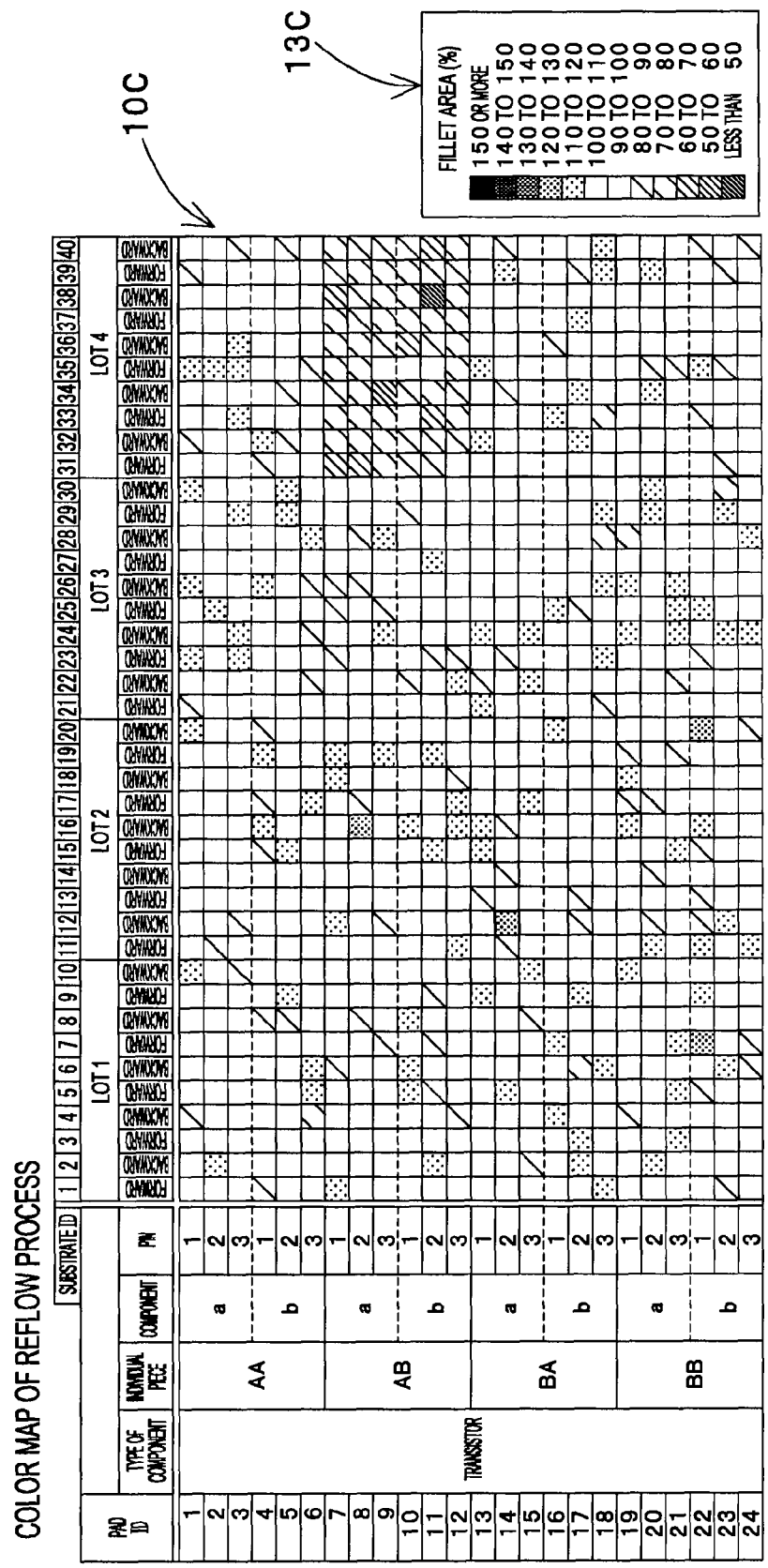

FIGS. 16A to 16C show color maps 10A, 10B, 100 of each step and display field 13A, 13B, 13C (indications of frame marks are not provided). The display field 13A, 13B, 13C and the display field 13A, 13B, 13C are extracted from the above screen. The display fields 13A, 13B, 13C represent relationship between the numerical ranges and the colors on the map.

In reality, the screen can be changed to the display showing only the color map 10 in this manner, or the screens of FIGS. 15 and 16A to 16C can be displayed in parallel using two monitor apparatuses. Alternatively, three monitor apparatuses may be arranged side by side, and these monitor apparatuses may individually show the display of each step.

A color map 10A of the solder print process has the same configuration as that of the previous embodiments. In the other two color maps 10B and 10C, the vertical axis direction is associated with the attribute information in the hierarchical structure in the same manner as that of the color map 10A, but the horizontal axis direction is associated with respectively different information.

More specifically, an identification number (either 1 or 2) of a component cassette used to mount a component to be displayed (transistor) is set to subordinate of the lots 1, 2, 3, 4 in the horizontal axis of the color map 10B. The hierarchical structure data is not set in the horizontal axis of the color map C. Only the lots 1, 2, 3, 4 are associated with the horizontal axis of the color map C.

Instead of the volumes of solders, colors converted from the amounts of vertical positional displacements with respect to the pads are set to the cells in the color map 10B. The amount of positional displacement is given a plus or minus sign representing the direction of positional displacement. The positional displacement in the range from −20 to +20 is set as a preferable numerical range. The numerical range of +20 or more is indicated in red-like color. The numerical range of −20 or less is indicated in blue-like color. Thus, the positional displacements are shown upon being divided into the plurality of ranges.

Colors converted from the areas of fillets of the pads are set to the cells in the color map 10C. This size is converted into percent using a predetermined value as a reference value, and the converted values are assigned with colors according to the definition similar to that for the solder volume.

According to this embodiment, the measured data of the same constituent element on the substrate can be compared between the processes. Therefore, how a certain process exerts an influence on another process can be easily found out. For example, according to FIGS. 16A to 16C, abnormal cells can also be seen in the color map 10C in the component mounting process, but the distribution thereof appears to be random. In contrast, abnormal cells in the color map 10 of the reflow process are concentrated on the same region as the region on which abnormal cells are concentrated in the color map 10A of the solder print process. Therefore, the amount of solder used in the solder print is considered to exert much influence on the process result of the reflow process.

Further, according to FIG. 15, when a selection operation is performed to select a cell in any one of the color maps 10A, 10B, 10C, an image of a pad corresponding to the selected cell is displayed in the corresponding one of the display fields 18A, 18B, 18C of the image in the screen in this embodiment, and the measured data are displayed in the corresponding one of display fields 19A, 19B, 19C. Therefore, a user can confirm the degree of abnormality by collating the color maps 10A to 10C with each other and collating the actual images showing the same portion with each other.

Regarding the display of quality control information, other conceivable embodiments will be explained.

In the above embodiments, the color map is generated with respect to the already-processed substrates whose production condition and measured data are stored in the server 1. However, the present invention is not limited thereto. Every time a process of one substrate is finished, data generated with respect to the substrate may be incorporated, and a color map may be displayed line by line. In this case, only the constituent elements of the substrate to be displayed may be specified, so that the measured data can be displayed with respect to the substrates processed in a predetermined period of time in the past.

With this configuration, a worker in each division can check the process state of the production line L along with the progress thereof. Therefore, when the measured data appears to deteriorate, the worker can swiftly check this, and can take necessary steps before a serious defect occurs. Alternatively, when the worker cannot always monitor the process state, the number of abnormal cells may be counted at a regular interval of time, and a warning may be output when this counted number exceeds a predetermined reference value.

When a non-preferable measured value is displayed in the color map, both of the red-like color and the blue-like color may not be shown according to the numerical ranges of the previous embodiments. Instead, the red-like color and the blue-like color may gradually reduce its brightness, as the measured value goes away from the preferable numerical range. Even though the magnitude of the measured data cannot be distinguished, the two-dimensional map may be generated in gray scale.

In the quality control system as shown in FIGS. 1 and 8, the server 1 generates display information such as the color map 10 according to a request from the terminal apparatus 5, and transmits the display information to the terminal apparatus 5. Alternatively, the terminal apparatus 5 may receive necessary information from the server 1, and may generate and display the color map 10.

Alternatively, a combination of the functions of the server 1 and the functions of the terminal apparatus 5 may be arranged in control units (i.e., computers built in the inspection apparatuses 3A, 3B, 3C or externally attached thereto) of the inspection apparatuses 3A, 3B, 3C of each process. In this case, the control units can check, as necessary, whether there is any decrease in the precisions of the processes performed by the corresponding manufacturing apparatuses 2A, 2B, 2C, while performing inspections. When any decrease is recognized, it is possible to swiftly take measures.

Further alternatively, for the purpose same as above, a combination of the functions of the server 1 and the functions of the terminal apparatus 5 may be arranged in control units (i.e., computers built in the manufacturing apparatuses 2A, 2B, 2C or externally attached thereto) of the manufacturing apparatuses 2A, 2B, 2C of each process. In this case, the manufacturing apparatuses 2A, 2B, 2C receive measured data about an inspected substrate from the inspection apparatuses 3A, 3B, 3C of the subsequent stage or the server 1, and generate display information such as color maps.

What is claimed is:

1. A system for displaying information for quality control of a component-mounted substrate that is produced in a production line, at least one process performed in the production line of the component-mounted substrate being adopted as a targeted process, and the system using measured data obtained in an inspection performed after the targeted process, the system comprising:
an attribute storage unit for storing, as an attribute of a measurement target section, a combination of identification information of constituent elements related to each of a plurality of measurement target sections included in one component-mounted substrate;
an attribute input unit configured to input, as an attribute of a substrate, information representing a production condition of the targeted process performed on each of the substrates;
a measured data input unit configured to input the measured data obtained for each of the measurement target sections of the substrates in the inspection of the targeted process;
a display information storage unit for storing display information in which numerical values included in the measured data are classified into a preferable numerical range and a non-preferable numerical range and the non-preferable numerical range is displayed in a color or shade different from that of the preferable numerical range;
a map image generation unit configured to generate a two-dimensional map image representing a distribution of the measured data upon setting a two-dimensional area and setting the color or shade to corresponding positions on the two-dimensional area including a first axis and a second axis, in which the identification information of the constituent elements stored in the attribute storage unit are arranged into a hierarchical structure based on relationship between the constituent elements, the first axis is arranged with the measurement target sections associated with said arrangement of the identification information of the constituent elements, the substrates to be displayed are arranged into an order of the substrates subjected to the targeted process, and the second axis is arranged with the identification information of the production conditions corresponding to the substrates in accordance with said order, the color or shade being obtained by applying the display information to the measured data that are input for each of the measurement target sections of the substrates; and
a display control unit configured to display, on a monitor apparatus, the two-dimensional map image generated by the map image generation unit.

2. The system according to claim 1, wherein in the hierarchical structure of the first axis, a type of component or a position in the entire substrate is superordinate, and an electrode or a component is subordinate.

3. The system according to claim 1, wherein the display information in the display information storage unit is defined such that a preferable numerical range A, a numerical range B whose value is larger than the numerical range A, and a numerical range C whose value is smaller than the numerical range A are displayed in different colors from each other, and the display information is defined such that, when values belonging to the numerical ranges B and C are displayed, a brightness of the displayed color decreases according to increase of a difference between a value to be displayed and the numerical range A.

4. The system according to claim 1, wherein the display control unit is configured to generate a substrate map image representing relationship between the measurement target sections and the constituent elements representing the attributes of the measurement target sections, and the substrate map image is displayed in proximity to the two-dimensional map image.

5. The system according to claim 1, wherein
a plurality of processes included in the production line are adopted as target processes,
the map image generation unit is configured to generate two-dimensional map images respectively for the target processes, the first axes of the two-dimensional map images being identical, and the display control unit configured to display, at a time, the two-dimensional map images of the targeted processes generated by the map image generation unit.

6. A method for displaying information for quality control of a component-mounted substrate that is produced in a production line, at least one process performed in the production line of the component-mounted substrate being adopted as a targeted process, and the system using measured data obtained in an inspection performed after the targeted process, the method comprising the following steps to be performed in advance:

setting, as an attribute of a measurement target section, a combination of constituent elements related to each of a plurality of measurement target sections included in one component-mounted substrate; and classifying the measured data obtained in the measuring process into a preferable numerical range and a non-preferable numerical range, and setting display information for representing the non-preferable numerical range in a color or shade different from that of the preferable numerical range, and the method further comprising the steps of:

inputting, as an attribute of a substrate, information representing a production condition of the targeted process performed on each of the substrates;

inputting the measured data obtained for each of the measurement target sections of the substrates in the inspection of the targeted process;

displaying, on a screen of a monitor apparatus, a two-dimensional map image representing a distribution of the measured data upon displaying a two-dimensional area and displaying the color or shade at corresponding positions on the two-dimensional area including a first axis and a second axis, in which the identification information of the constituent elements representing the attributes of the measurement target sections are arranged into a hierarchical structure based on relationship between the constituent elements, the first axis is arranged with the measurement target sections associated with said arrangement of the identification information of the constituent elements, the identification information of the substrates to be displayed are arranged into an order of the substrates subjected to the targeted process, and the second axis is arranged with the identification information of the production conditions corresponding to the substrates in accordance with said order, the color or shade being obtained by applying the display information to the measured data that are input for each of the measurement target sections of the substrates.

* * * * *